(12) United States Patent
Cheng et al.

(10) Patent No.: US 9,343,320 B2
(45) Date of Patent: May 17, 2016

(54) PATTERN FACTOR DEPENDENCY ALLEVIATION FOR EDRAM AND LOGIC DEVICES WITH DISPOSABLE FILL TO EASE DEEP TRENCH INTEGRATION WITH FINS

(71) Applicant: GLOBALFOUNDRIES INC., Grand Cayman (KY)

(72) Inventors: Kangguo Cheng, Schenectady, NY (US); Joseph Ervin, New York, NY (US); Juntao Li, Guilderland, NY (US); Chengwen Pei, Danbury, CT (US); Geng Wang, Stormville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 56 days.

(21) Appl. No.: 14/098,650

(22) Filed: Dec. 6, 2013

(65) Prior Publication Data

US 2015/0162337 A1 Jun. 11, 2015

(51) Int. Cl.
*H01L 27/108* (2006.01)
*H01L 21/306* (2006.01)
*H01L 21/308* (2006.01)
*H01L 21/768* (2006.01)
*H01L 21/3205* (2006.01)
*H01L 21/84* (2006.01)
*H01L 29/66* (2006.01)
*H01L 29/94* (2006.01)
*H01L 27/12* (2006.01)

(52) U.S. Cl.
CPC ...... *H01L 21/30604* (2013.01); *H01L 21/3081* (2013.01); *H01L 21/84* (2013.01); *H01L 27/1087* (2013.01); *H01L 27/10826* (2013.01); *H01L 27/10829* (2013.01); *H01L 27/10867* (2013.01); *H01L 27/10879* (2013.01); *H01L 27/1203* (2013.01); *H01L 29/66181* (2013.01); *H01L 29/945* (2013.01)

(58) Field of Classification Search
None
See application file for complete search history.

(56) References Cited

U.S. PATENT DOCUMENTS

| | | | |
|---|---|---|---|
| 7,323,375 | B2 | 1/2008 | Yoon et al. |
| 7,915,659 | B2 | 3/2011 | Juengling |
| 7,943,961 | B2 | 5/2011 | Wang et al. |
| 8,304,836 | B2 | 11/2012 | Jagannathan et al. |
| 2011/0210393 | A1 | 9/2011 | Chen et al. |
| 2012/0220102 | A1 | 8/2012 | Or-Bach et al. |
| 2013/0023115 | A1 | 1/2013 | Fan et al. |
| 2013/0065371 | A1 | 3/2013 | Wei et al. |
| 2013/0320423 | A1 * | 12/2013 | Beaudoin et al. ............ 257/301 |

FOREIGN PATENT DOCUMENTS

| | | | |
|---|---|---|---|
| EP | 856890 A1 * | 8/1998 | |
| KR | 10-2005-0011952 A | 1/2005 | |
| WO | 2008/008204 A1 | 1/2008 | |

* cited by examiner

*Primary Examiner* — Robert Carpenter
(74) *Attorney, Agent, or Firm* — Scully Scott Murphy and Presser; Frank Digiglio

(57) ABSTRACT

Dummy deep trenches can be formed within a logic device region in which logic devices are to be formed while deep trench capacitors are formed within a memory device region. Semiconductor fins are formed over a top surface prior to forming trenches, and disposable material is filled around said semiconductor fins. A top surface of said disposable filler material layer can be coplanar with a top surface of said semiconductor fins, which eases deep trench formation. Conductive material portions of the dummy deep trenches can be recessed to avoid electrical contact with semiconductor fins within the logic device region, while an inner electrode of each deep trench can contact a semiconductor fin within the memory device region. A dielectric material portion can be formed above each conductive material portion of a dummy deep trench.

9 Claims, 42 Drawing Sheets

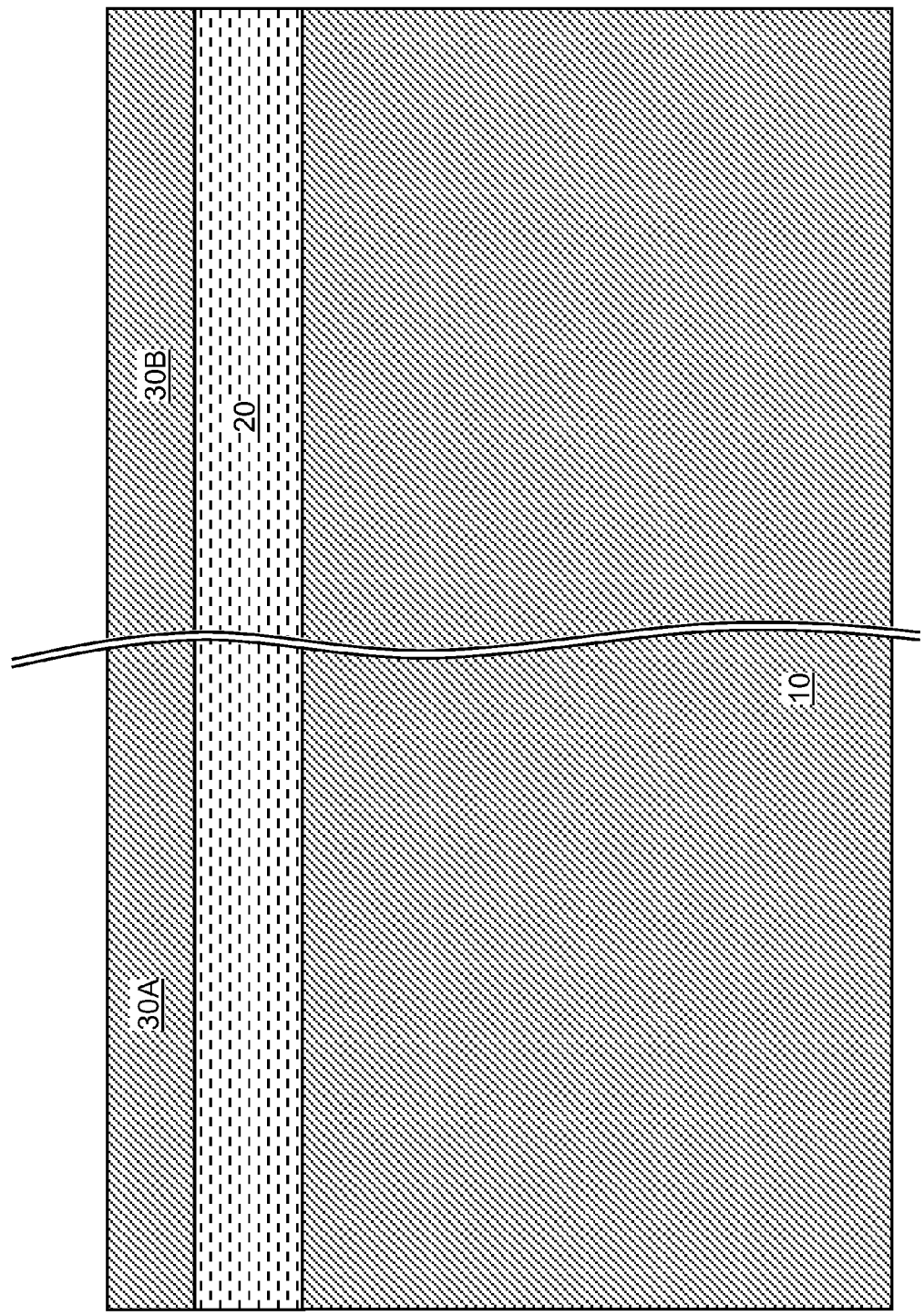

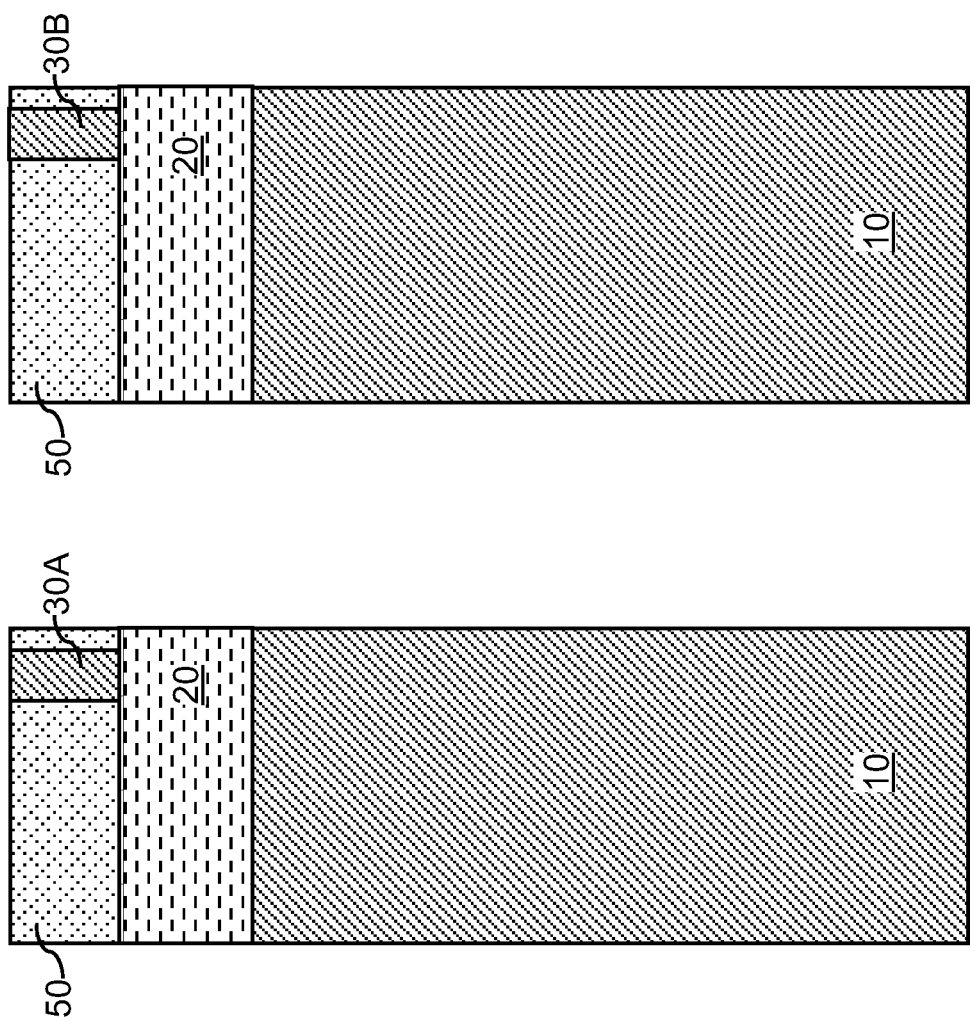

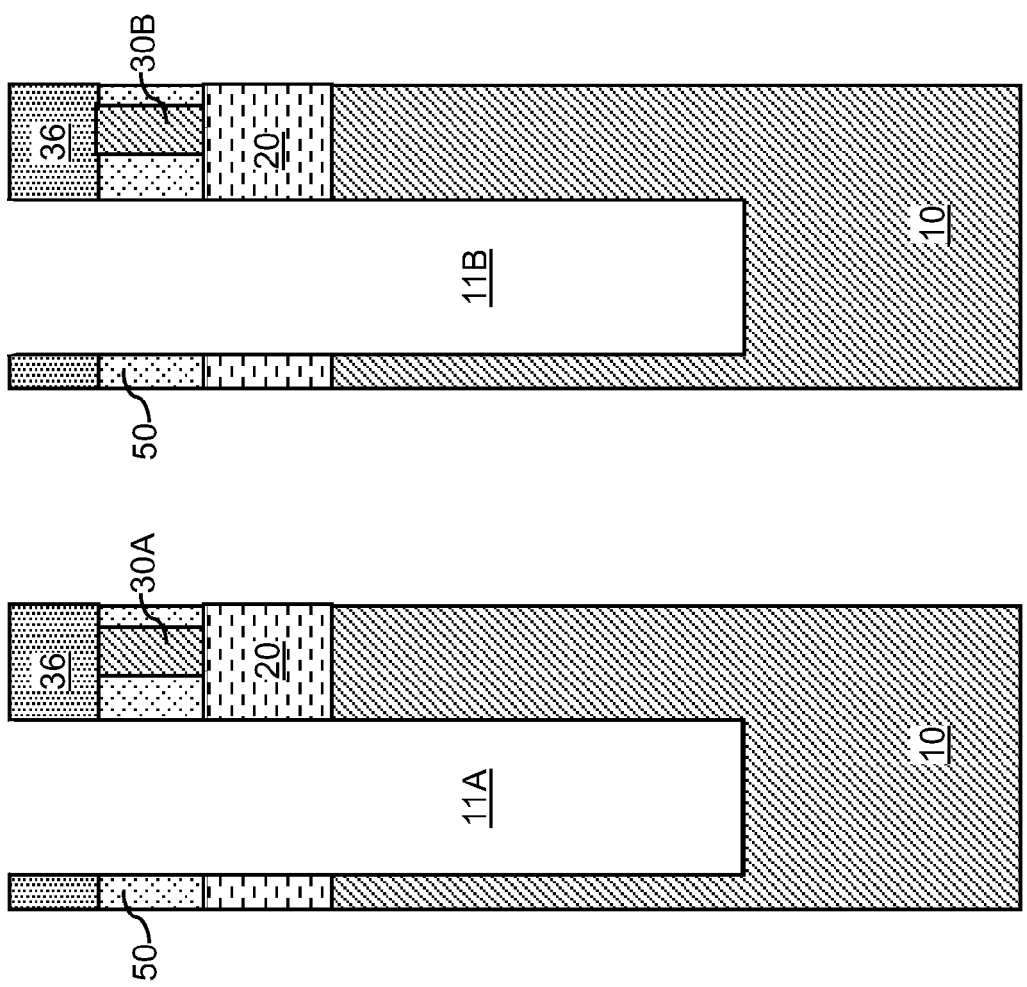

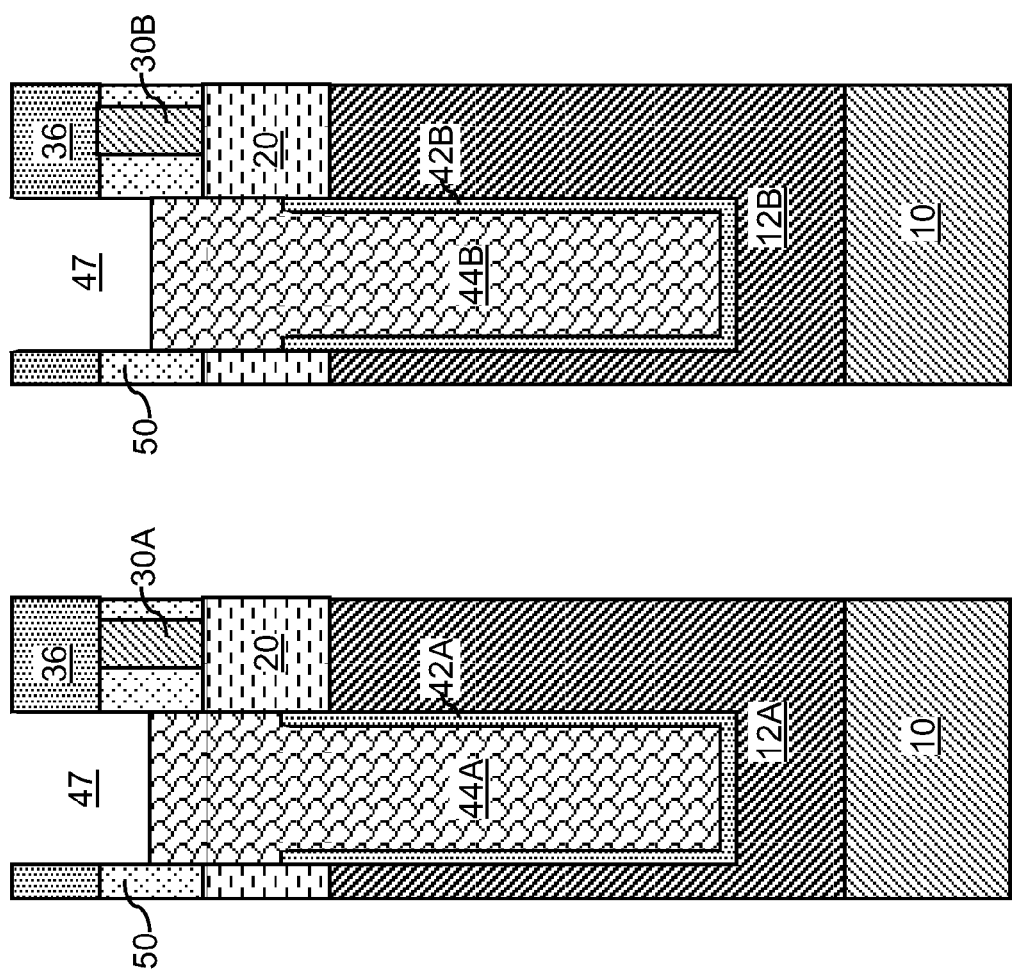

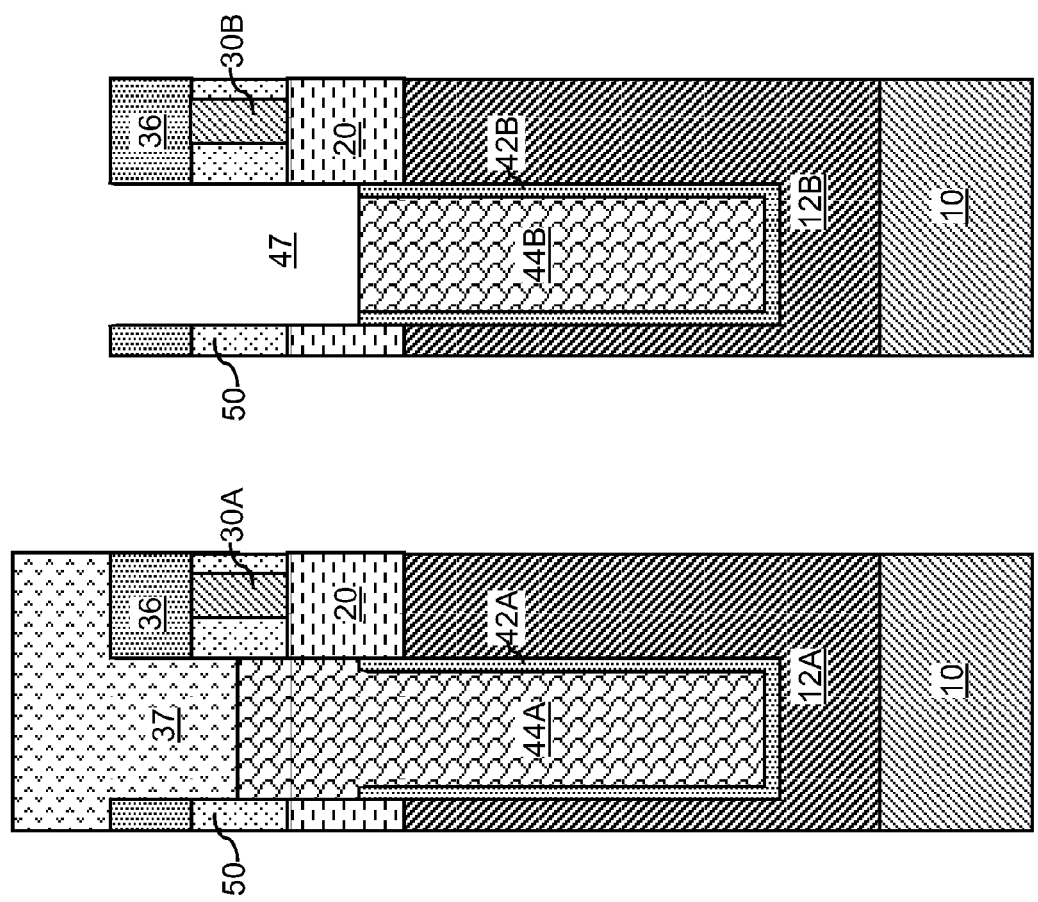

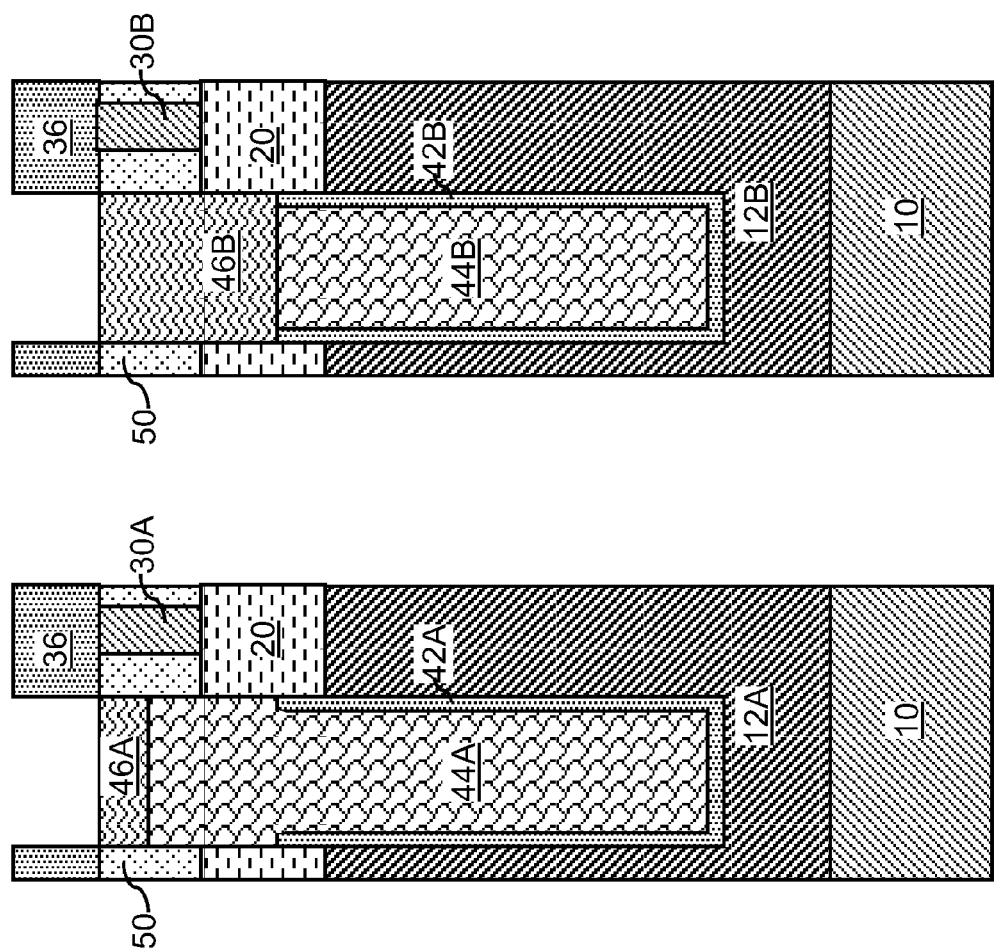

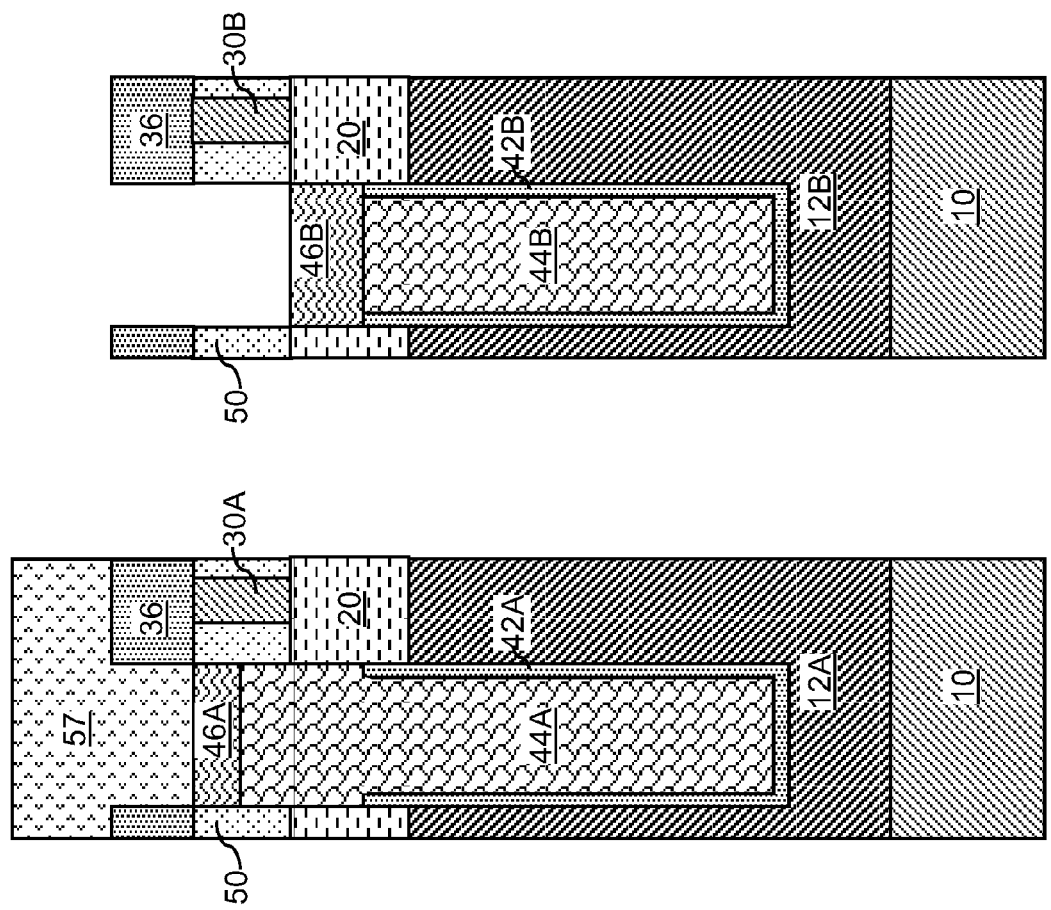

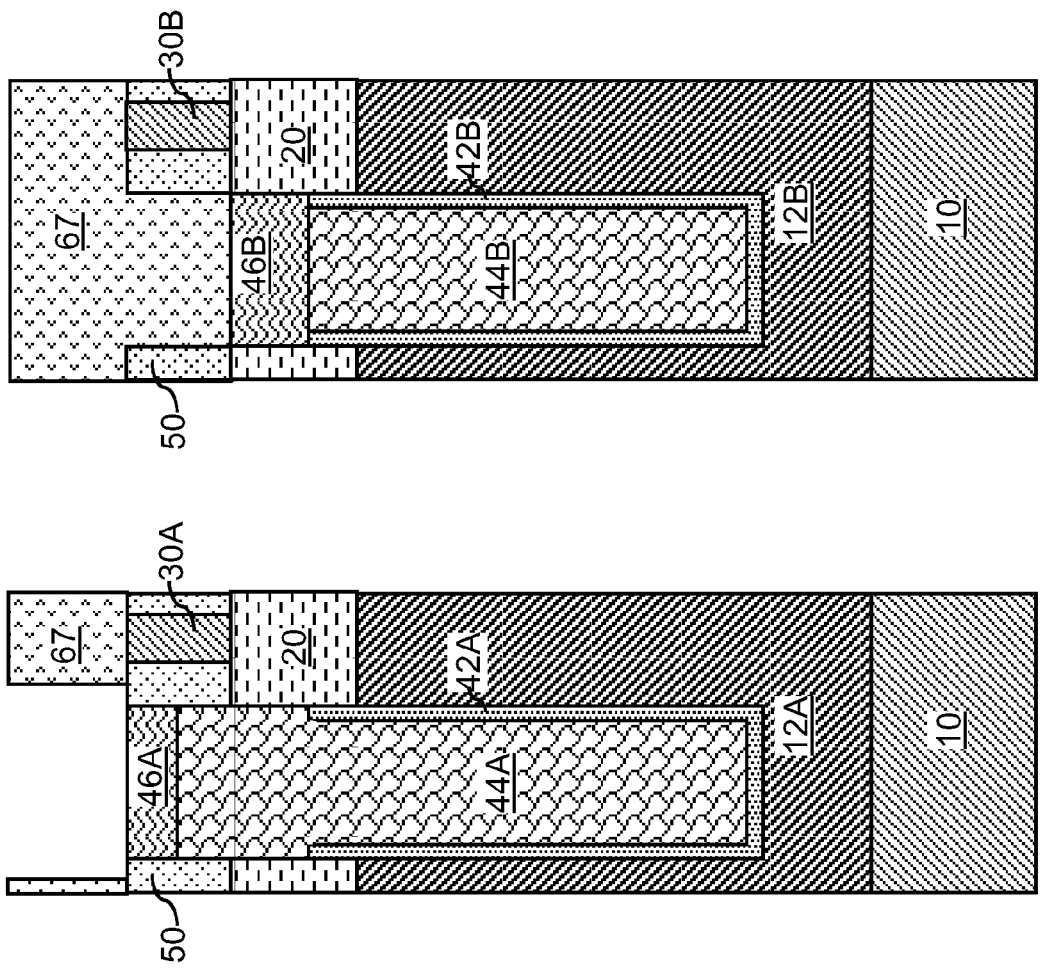

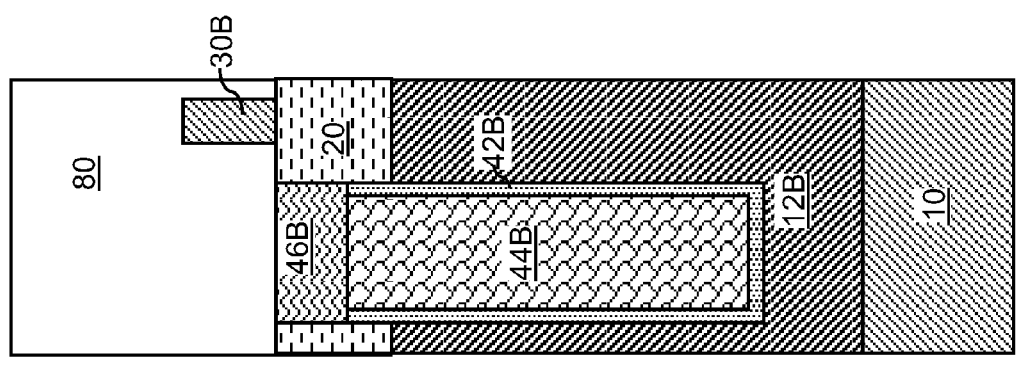
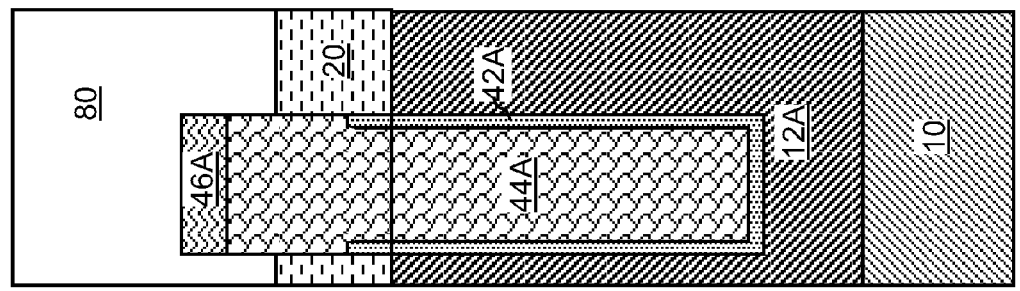

US 9,343,320 B2

PATTERN FACTOR DEPENDENCY ALLEVIATION FOR EDRAM AND LOGIC DEVICES WITH DISPOSABLE FILL TO EASE DEEP TRENCH INTEGRATION WITH FINS

BACKGROUND

The present disclosure relates to a semiconductor structure, and particularly to semiconductor devices including embedded dynamic random access memory (eDRAM) cells and logic devices, and a method of manufacturing the same.

Deep trench capacitors are used in a variety of semiconductor chips for high areal capacitance and low device leakage. Typically, a deep trench capacitor provides a capacitance in the range from 4 fF (femto-Farad) to 120 fF. A deep trench capacitor may be employed as a charge storage unit in a dynamic random access memory (DRAM), which may be provided as a stand-alone semiconductor chip, or may be embedded in a system-on-chip (SoC) semiconductor chip. A deep trench capacitor may also be employed in a variety of circuit applications such as a charge pump or a capacitive analog component in a radio-frequency (RF) circuit.

Trench profiles and the depths of deep trenches formed in a semiconductor substrate depend on the areal density of deep trenches, i.e., on the fraction of the area of the deep trenches with respect to the total area of a substrate in which deep trenches are to be formed. Further, local density of deep trenches can affect the profiles and the depths of the deep trenches. In a semiconductor chip including embedded DRAM cells and logic devices, therefore, structural features and performance of deep trench capacitors can depend on the area of logic devices within the vicinity of the deep trench capacitors. Therefore, a scheme is desired for alleviating the dependence of the structural features and performance of deep trench capacitors on the local device environment.

SUMMARY

Dummy deep trenches can be formed within a logic device region in which logic devices are to be formed while deep trench capacitors are formed within a memory device region. Conductive material portions of the dummy deep trenches can be recessed to avoid electrical contact with semiconductor fins within the logic device region, while an inner electrode of each deep trench can contact a semiconductor fin within the memory device region. A dielectric material portion can be formed above each conductive material portion of a dummy deep trench. A top surface of each dielectric material portion can be located at, or below, the top surface of a insulator layer. Alternatively or additionally, the conductive material portion of each dummy deep trench can be laterally spaced from semiconductor fins within the logic device region by a dielectric material.

According to an aspect of the present disclosure, a semiconductor structure includes a dielectric material liner located within a lower portion of a trench in a substrate. Outer surfaces of the dielectric material liner contacts surfaces of a buried plate including a doped semiconductor material and inner surfaces of the dielectric material liner contact a conductive material portion. The semiconductor structure further includes a trench top dielectric portion located within an upper portion of the trench and contacting the dielectric material liner and an entirety of a top surface of the conductive material portion. An insulator layer laterally contacts sidewalls of the trench top dielectric portion and the dielectric material liner. The conductive material portion is encapsulated by the dielectric material liner and the trench top dielectric portion.

According to another aspect of the present disclosure, a method of forming a semiconductor structure is provided. A trench is formed through an insulator layer and into a semiconductor material layer within a substrate. A buried plate is formed around a bottom portion of the trench, the buried plate including a doped semiconductor material. A dielectric material liner is formed on a surface of the buried plate. A conductive material portion is formed within the dielectric material liner. A trench top dielectric portion is formed within an upper portion of the trench and directly on a top surface of the conductive material portion and on sidewall surfaces of the insulator layer. The conductive material portion is encapsulated by the dielectric material liner and the trench top dielectric portion.

BRIEF DESCRIPTION OF SEVERAL VIEWS OF THE DRAWINGS

FIG. 2B is a vertical cross-sectional view of the first exemplary semiconductor structure along the vertical plane B-B' of FIG. 2A.

FIG. 2C is a vertical cross-sectional view of the first exemplary semiconductor structure along the vertical plane C-C' of FIG. 2A.

FIG. 2D is a vertical cross-sectional view of the first exemplary semiconductor structure along the vertical plane D-D' of FIG. 2A.

FIG. 3C is a vertical cross-sectional view of the first exemplary semiconductor structure along the vertical plane C-C' of FIG. 3A.

FIG. 3D is a vertical cross-sectional view of the first exemplary semiconductor structure along the vertical plane D-D' of FIG. 3A.

FIG. 4C is a vertical cross-sectional view of the first exemplary semiconductor structure along the vertical plane C-C' of FIG. 4A.

FIG. 4D is a vertical cross-sectional view of the first exemplary semiconductor structure along the vertical plane D-D' of FIG. 4A.

FIG. 5C is a vertical cross-sectional view of the first exemplary semiconductor structure along the vertical plane C-C' of FIG. 5A.

FIG. 5D is a vertical cross-sectional view of the first exemplary semiconductor structure along the vertical plane D-D' of FIG. 5A.

FIG. 7C is a vertical cross-sectional view of the first exemplary semiconductor structure along the vertical plane C-C' of FIG. 7A.

FIG. 7D is a vertical cross-sectional view of the first exemplary semiconductor structure along the vertical plane D-D' of FIG. 7A.

FIG. 8C is a vertical cross-sectional view of the first exemplary semiconductor structure along the vertical plane C-C' of FIG. 8A.

FIG. 8D is a vertical cross-sectional view of the first exemplary semiconductor structure along the vertical plane D-D' of FIG. 8A.

FIG. 10C is a vertical cross-sectional view of the first exemplary semiconductor structure along the vertical plane C-C' of FIG. 10A.

FIG. 10D is a vertical cross-sectional view of the first exemplary semiconductor structure along the vertical plane D-D' of FIG. 10A.

FIG. 12C is a vertical cross-sectional view of the first exemplary semiconductor structure along the vertical plane C-C' of FIG. 12A.

FIG. 12D is a vertical cross-sectional view of the first exemplary semiconductor structure along the vertical plane D-D' of FIG. 12A.

DETAILED DESCRIPTION

Figure 1A:
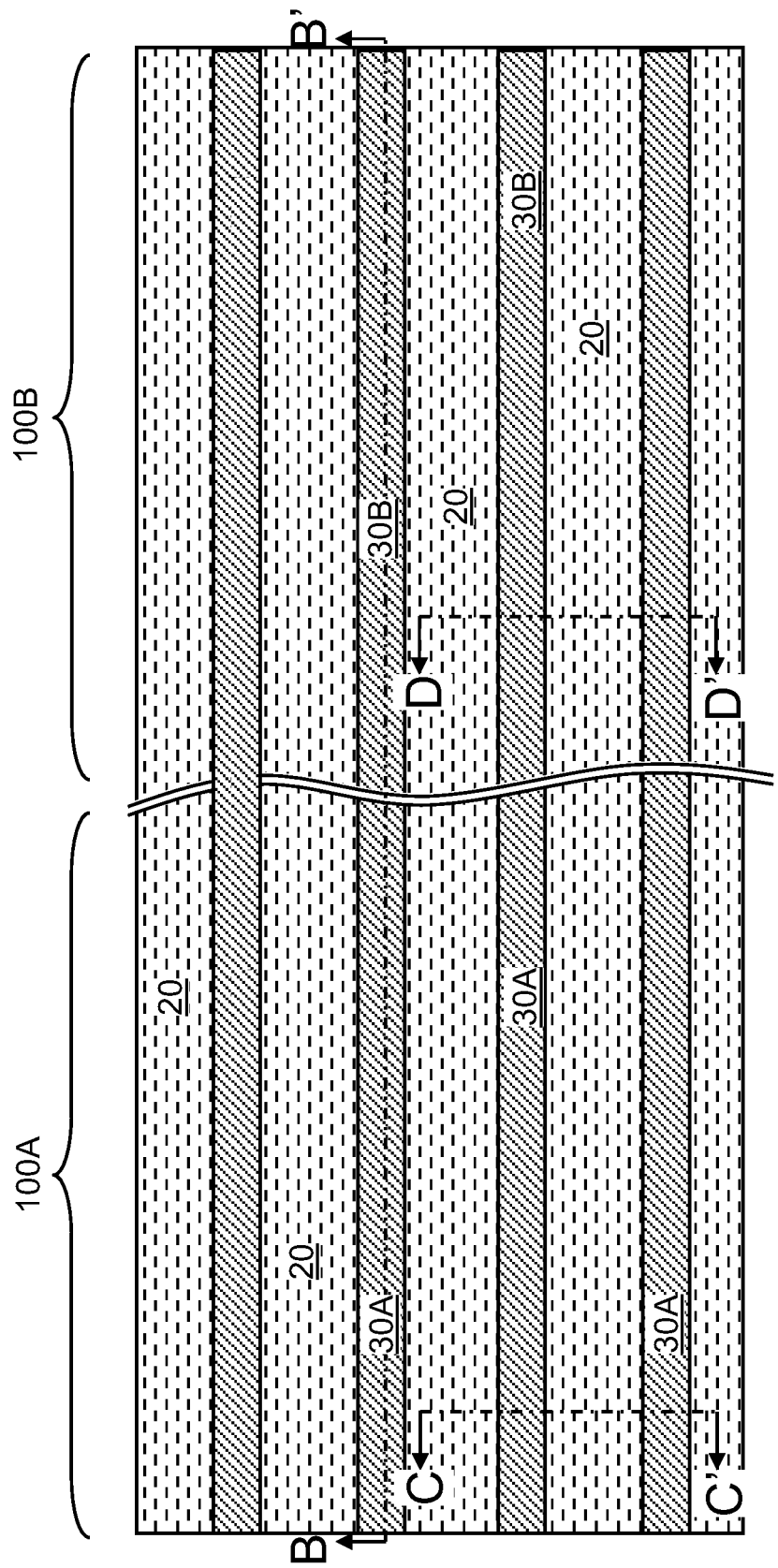
FIG. 1A is a top-down view of a first exemplary semiconductor structure after formation of semiconductor fins on a semiconductor-on-insulator (SOI) substrate according to a first embodiment of the present disclosure.

As stated above, the present disclosure relates to semiconductor devices including embedded dynamic random access memory (eDRAM) cells and logic devices, and a method of manufacturing the same. These aspects of the present disclosure are now described in detail with accompanying figures. It is noted that like reference numerals refer to like elements across different embodiments. The drawings are not necessarily drawn to scale.

Figure 1B:
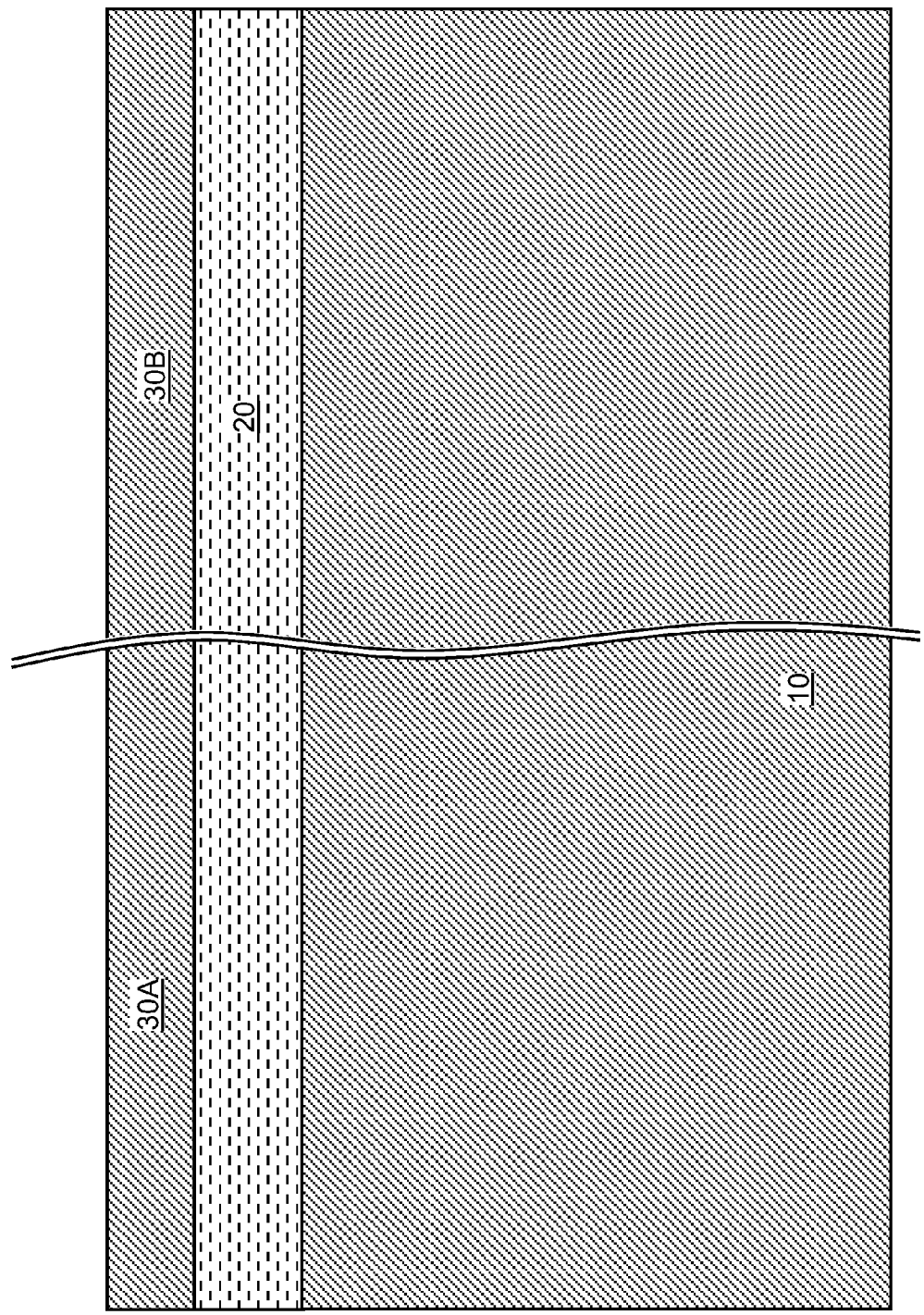
FIG. 1B is a vertical cross-sectional view of the first exemplary semiconductor structure along the vertical plane B-B' of FIG. 1A.
Figure 1C:
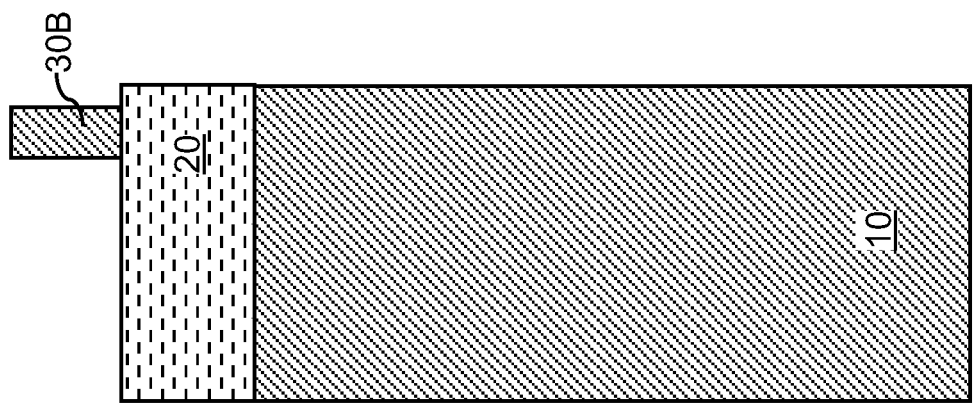
FIG. 1C is a vertical cross-sectional view of the first exemplary semiconductor structure along the vertical plane C-C' of FIG. 1A.
Figure 1D:
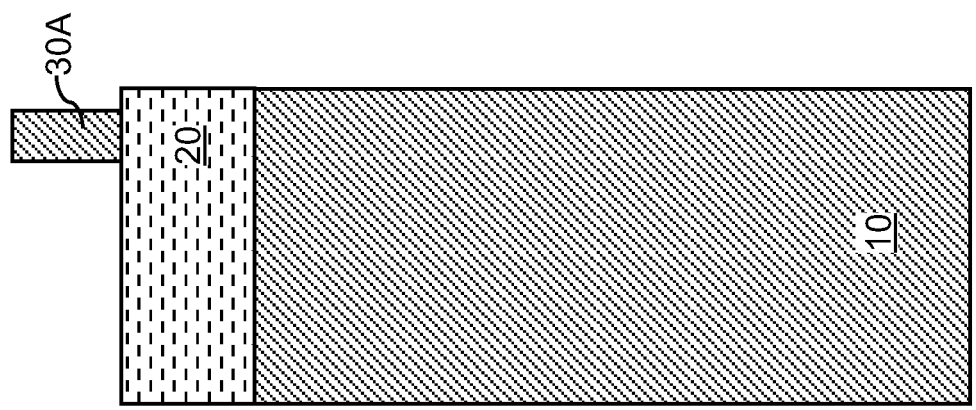
FIG. 1D is a vertical cross-sectional view of the first exemplary semiconductor structure along the vertical plane D-D' of FIG. 1A.

Referring to FIGS. 1A-1D, a first exemplary semiconductor structure according to a first embodiment of the present disclosure, which can be semiconductor-on-insulator (SOI) substrate or a bulk semiconductor substrate.

In one embodiment, the semiconductor substrate can be an SOI substrate including a semiconductor material layer 10, an insulator layer 20, and a top semiconductor located on a top surface of the insulator layer 20. Each of the semiconductor material layer and the top semiconductor layer includes a semiconductor material, which can be independently selected from elemental semiconductor materials (e.g., silicon, germanium, carbon, or alloys thereof), III-V semiconductor materials, or II-VI semiconductor materials. In one embodiment, the semiconductor substrate can include a single crystalline semiconductor material.

The top semiconductor layer can be patterned, by a combination of lithographic methods and an anisotropic etch, to form a plurality of semiconductor fins (30A, 30B). The plurality of semiconductor fins (30A, 30B) can include first semiconductor fins 30A formed in a first device region 100A and second semiconductor fins 30B formed in a second device region 100B. In one embodiment, the first device region 100A can be a memory device region, and the second device region 100B can be a logic device region. The height of the semiconductor fins (30A, 30B) can be from 5 nm to 300 nm, although lesser and greater heights can also be employed. The plurality of semiconductor fins (30A, 30B) can be doped with electrical dopants, i.e., p-type dopants or n-type dopants, or can be intrinsic. In one embodiment, the entirety of the plurality of semiconductor fins (30A, 30B) can have a same type of doping, which is herein referred to as a first conductivity type.

As used herein, a "semiconductor fin" refers to a semiconductor material portion having a pair of parallel vertical sidewalls that are laterally spaced by a uniform dimension. In one embodiment, each semiconductor fin can have a rectangular horizontal cross-sectional area such that the spacing between the pair of parallel vertical sidewalls is the same as the length of shorter sides of the shape of the rectangular horizontal cross-sectional area. As used herein, a "fin field effect transistor" refers to a field effect transistor in which at least a channel region is located within a semiconductor fin.

In another embodiment, the semiconductor substrate can be a bulk semiconductor substrate including any of the semiconductor materials that can be employed for the top semiconductor layer of an SOI substrate. In this case, an upper portion of the bulk semiconductor substrate can be patterned to form a plurality of semiconductor fins (30A, 30B). The remaining portion of the bulk semiconductor substrate underlying the plurality of semiconductor fins (30A, 30B) can be semiconductor material layer, which is of integral construction with the plurality of semiconductor fins (30A, 30B). The plurality of semiconductor fins (30A, 30B) and the semiconductor material layer can be doped with electrical dopants, i.e., p-type dopants or n-type dopants, or can be intrinsic. In one embodiment, the entirety of the plurality of semiconductor fins (30A, 30B) and the semiconductor material layer can have a same type of doping, which is herein referred to as a first conductivity type. A shallow trench isolation layer (not shown) can be formed on the to surface of the semiconductor material layer and around lower portions of the plurality of semiconductor fins (30A, 30B) to provide electrical isolation among the plurality of semiconductor fins. Optionally, various doped well structures can be formed to provide electrical isolation among the semiconductor fins (30A, 30B).

Each semiconductor fin (30A, 30B) is laterally bound by a pair of lengthwise sidewalls and a pair of widthwise sidewalls. As used herein, a "lengthwise direction" of an element refers to a direction about which the moment of inertia of the element becomes a minimum. As used herein, a "lengthwise sidewall" of an element refers to a sidewall of an element that extends along the lengthwise direction of the element. As used herein, a "widthwise sidewall" of an element refers to a sidewall of the element that extends along a horizontal direction that is perpendicular to the lengthwise direction of the element. In one embodiment, each of the plurality of semiconductor fins (30A, 30B) can have a rectangular horizontal cross-sectional shape.

In one embodiment, the plurality of semiconductor fins (30A, 30B) can be within a one-dimensional array having a pitch along the widthwise direction of the semiconductor fins (30A, 30B).

Figure 2A:
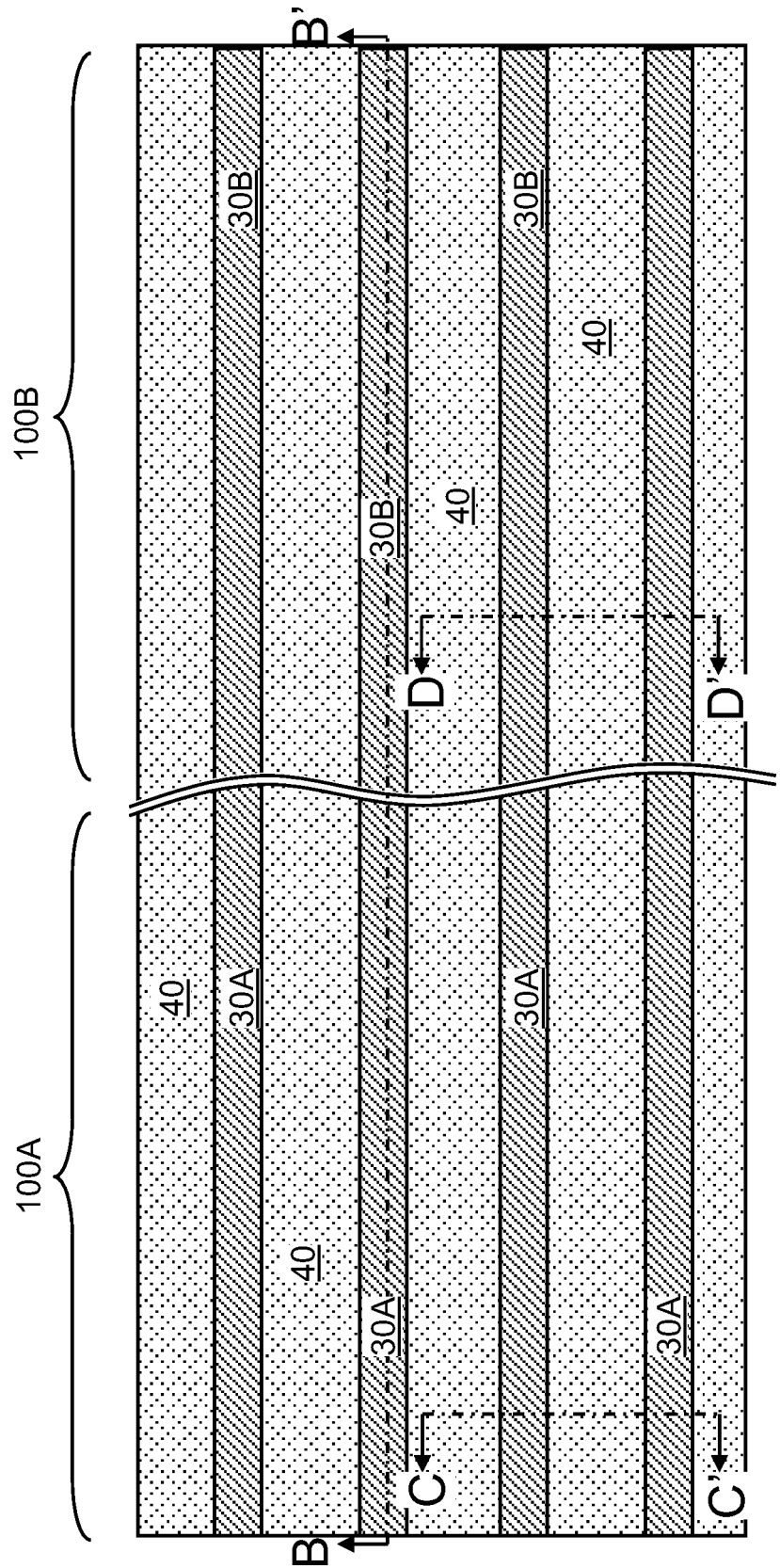
FIG. 2A is a top-down view of the first exemplary semiconductor structure after formation of a disposable filler material layer according to the first embodiment of the present disclosure.

Referring to FIGS. 2A-2D, a disposable filler material layer 50 is formed around the semiconductor fins (30A, 30B). The disposable filler material layer 50 includes a disposable filler material, which can be a semiconductor material or a dielectric material. The disposable filler material is a selected among materials that can be removed selective to the materials of the semiconductor fins (30A, 30B) and the insulator layer 20. For example, the semiconductor fins (30A, 30B) can include single crystalline silicon, and the disposable filler material layer 50 can include germanium, a silicon germanium alloy, amorphous carbon, organosilicate glass, or combinations thereof. The disposable filler material can be deposited, for example, by chemical vapor deposition (CVD) or spin coating. Excess portions of the disposable filler material can be removed from above the top surfaces of the semiconductor fins (30A, 30B) employing a planarization process such as a chemical mechanical planarization (CMP) process. The plurality of semiconductor fins (30A, 30B) and the disposable filler material layer 50 complementarily fill the space between a horizontal plane including the top surface of the insulator layer 20 and a horizontal plane the top surface of the plurality of semiconductor fins (30A, 30B) within the area of the insulator layer 20.

In one embodiment, the disposable filler material can have comparable etch property to the semiconductor fins (30A, 30B) during a subsequent deep trench etch (which is an anisotropic reactive ion etch), yet provides a different etch property during a subsequent etch process (which can be an isotropic etch process) that removes the disposable filler material selective to the semiconductor material of the semiconductor fins (30A, 30B). For example, a silicon germanium alloy or amorphous silicon can be employed as the disposable filler material to provide a similar etch characteristic during the anisotropic reactive ion etch as single crystalline silicon in the semiconductor fins (30A, 30B), and yet, can be etched selectively to the single crystalline silicon material in the semiconductor fins (30A, 30B) by an HCl gas phase etch at a temperature between 450° C. and 800° C. The disposable filler material between the semiconductor fins (30A, 30B) help fabricate flat surface on wafer after a chemical mechanical planarization (CMP) process, without damage or distortion semiconductor fins (30A, 30B), so that deep trenches could be fabricated along standard deep trench process even with the presence of the semiconductor fins (30A, 30B).

Figure 3A:
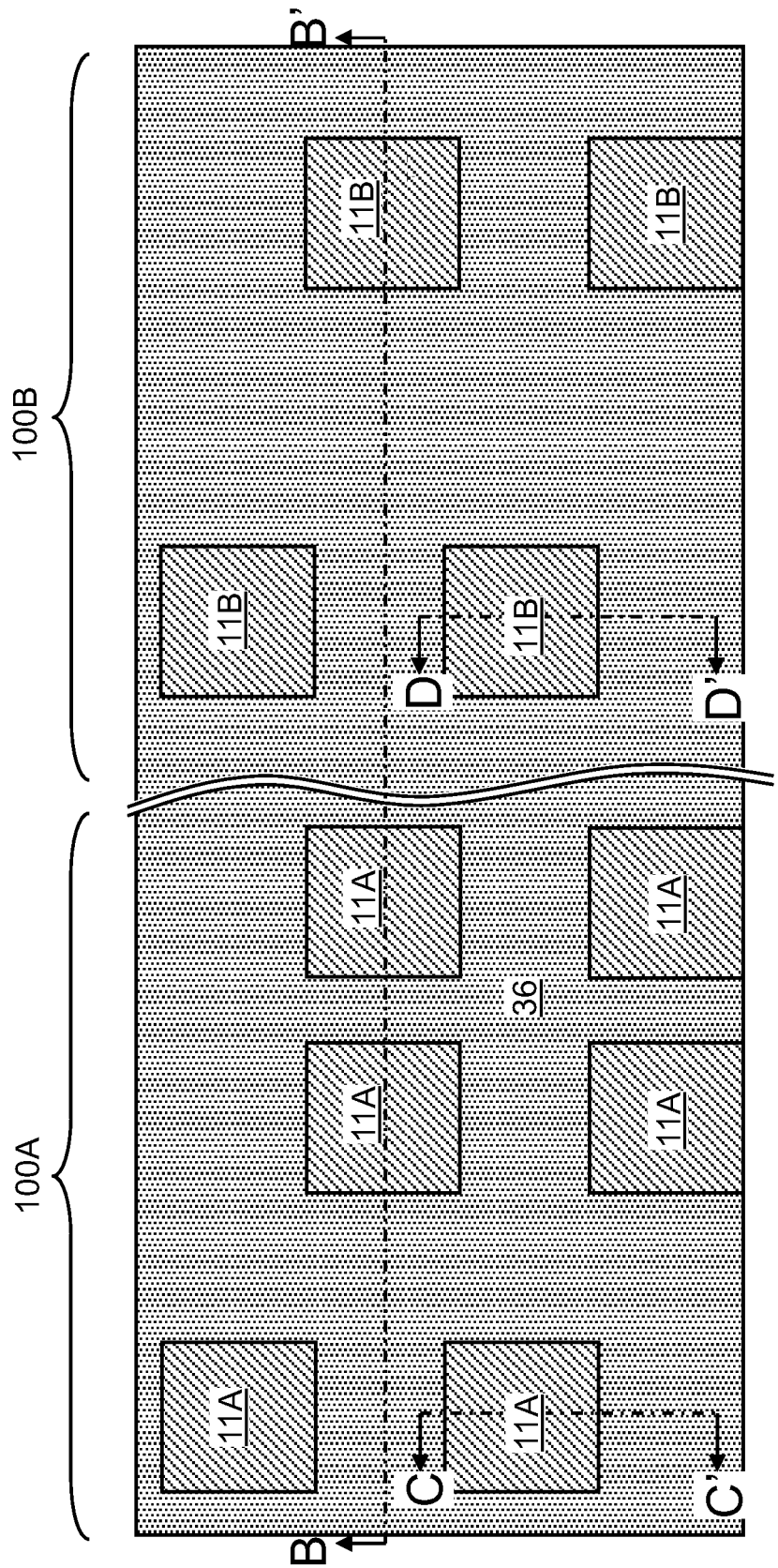
FIG. 3A is a top-down view of the first exemplary semiconductor structure after formation deep trenches according to the first embodiment of the present disclosure.
Figure 3B:
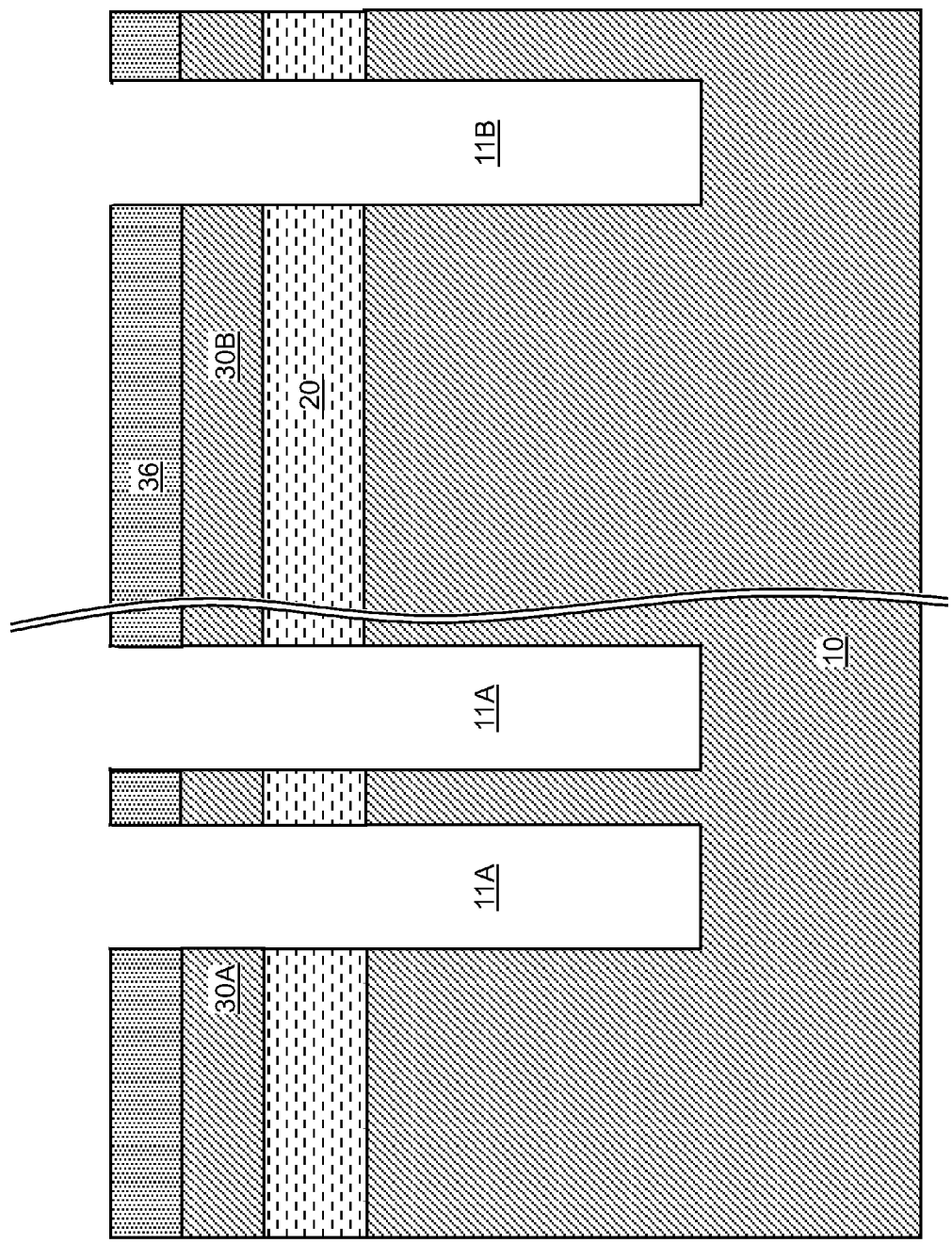
FIG. 3B is a vertical cross-sectional view of the first exemplary semiconductor structure along the vertical plane B-B' of FIG. 3A.

Referring to FIGS. 3A-3D, a mask layer 36 can be deposited over the combination including the plurality of semiconductor fins (30A, 30B) and the disposable filler material layer 50, for example, by chemical vapor deposition (CVD). The mask layer 36 can include one or more layers that can be employed as an etch mask for forming trenches (11A, 11B) through the insulator layer 20 and the semiconductor material layer 10. In one embodiment, the mask layer 36 can include a dielectric material such as a doped or undoped silicon oxide, silicon nitride, a dielectric metal nitride, or a dielectric metal oxide. The thickness of the mask layer 36 can be from 100 nm to 2,000 nm, although lesser and greater thicknesses can also be employed.

A photoresist layer (not shown) can be applied over the mask layer 36, and can be lithographically patterned to form at least one opening having an area of a trench (11A, 11B) to be subsequently formed. The pattern in the photoresist layer can be transferred into the mask layer 36.

Subsequently, the pattern in the mask layer 36 can be transferred through the underlying portions of the plurality of semiconductor fins (30A, 30B) and the disposable filler material layer 50, the insulator layer 20, and an upper portion of the semiconductor material layer 10 by an anisotropic etch. The anisotropic etch can employ the patterned mask layer 36 and any remaining portion of the photoresist layer (if present) as an etch mask. A trench (11A, 11B) can be formed for each opening in the mask layer 36. The photoresist can be removed by ashing, or can be consumed during the etch process that forms the trenches (11A, 11B).

The trenches (11A, 11B) include first trenches 11A formed in the first device region 100A and second trenches 11B formed in the second device region 100B. In one embodiment, locations of the openings in the photoresist layer and the mask layer 36 can be selected such that the trenches (11A, 11B) cut through the semiconductor fins (30A, 30B). For example, the opening in the patterned mask layer 36 overlies the semiconductor fins (30A, 30B). The semiconductor fins (30A, 30B) can be cut into disjoined semiconductor fins (30A, 30B) of a greater number. Neighboring pairs of disjoined semiconductor fins (30A, 30B) after formation of the trenches (11A, 11B) are separated by a width of a trench (11A or 11B) after transfer of the pattern of the opening through the layer including the semiconductor fins (30A, 30B) and the disposable filler material layer 50.

In one embodiment, neighboring pairs of first trenches 11A can be formed over the same first semiconductor fin 30A within the first device region 100A, and the second trenches 11B in the second device region 100B can be formed as isolated trenches, i.e., without pairing with another second trench 11B.

Sidewalls of the semiconductor fins (30A, 30B) as cut by the trenches (11A, 11B) can be vertically coincident with sidewalls of the trenches (11A, 11B). As used herein, sidewalls of multiple elements are "vertically coincident" if the sidewalls of the multiple elements overlap in a top-down view s.

The depth of the trenches (11A, 11B) as measured from the plane of the topmost surface of the semiconductor fins (30A, 30B) to the bottom surface of the trench (11A, 11B) can be from 500 nm to 10 microns, although lesser and greater depths can also be employed. In one embodiment, the trench (11A, 11B) can be a deep trench. As used herein, a "deep trench" refers to a trench that having a depth greater than 2.0 microns. The lateral dimensions of each trench (11A, 11B) can be limited by the lithographic capabilities, i.e., the ability of a lithographic tool to print the image of an opening on the photoresist layer. The first trenches 11A and the second trenches 11B can be simultaneously formed.

In one embodiment, the disposable filler material layer 50 can provide a comparable level of etch resistance to the etch chemistry as the semiconductor fins (30A, 30B) during the anisotropic etch process that forms the trenches (11A, 11B) so that bottom surfaces of the trenches (11A, 11B) are formed as flat surfaces without steps therein.

The second device region 100B may not require use of a trench capacitor to form semiconductor devices. In the absence of any trenches in the second device region 100B, the etch process for forming trenches within the first device region 100A alone becomes pattern-factor dependent, i.e., the properties of trenches formed in the first device region 100A becomes dependent on the percentage of the substrate including trenches (commonly referred to as a "loading factor," and the whether a trench is formed within at a periphery of the first device region 100A or at the center of the first device region 100B. Addition of trenches within the second device region 100B can make the substrate maintain a predefined level of loading factor for the substrate, and local variations of the characteristics of trenches due to local variations of the density of trenches can be minimized.

Figure 4A:
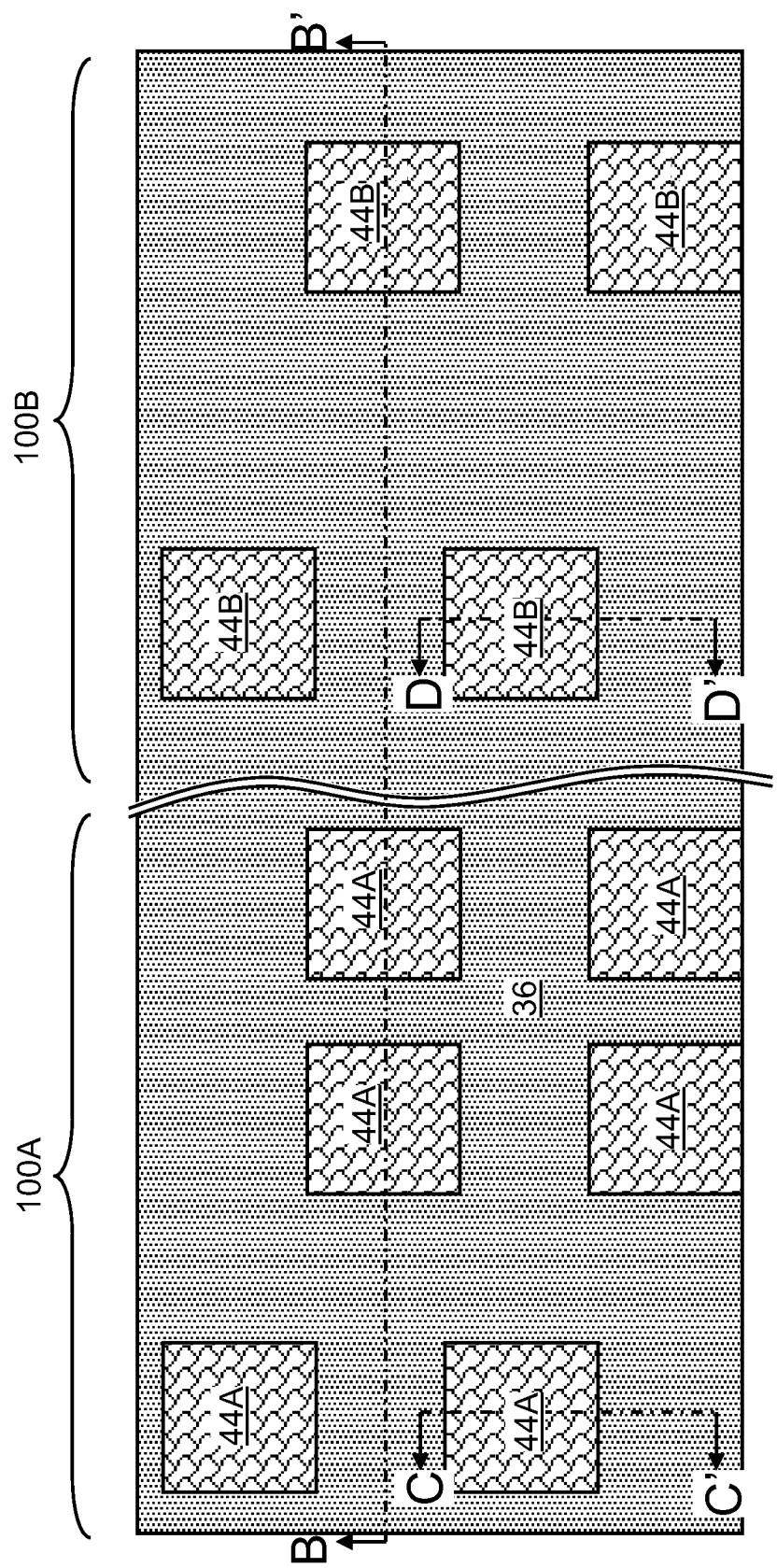
FIG. 4A is a top-down view of the first exemplary semiconductor structure after formation of a deep trench capacitor according to the first embodiment of the present disclosure.
Figure 4B:
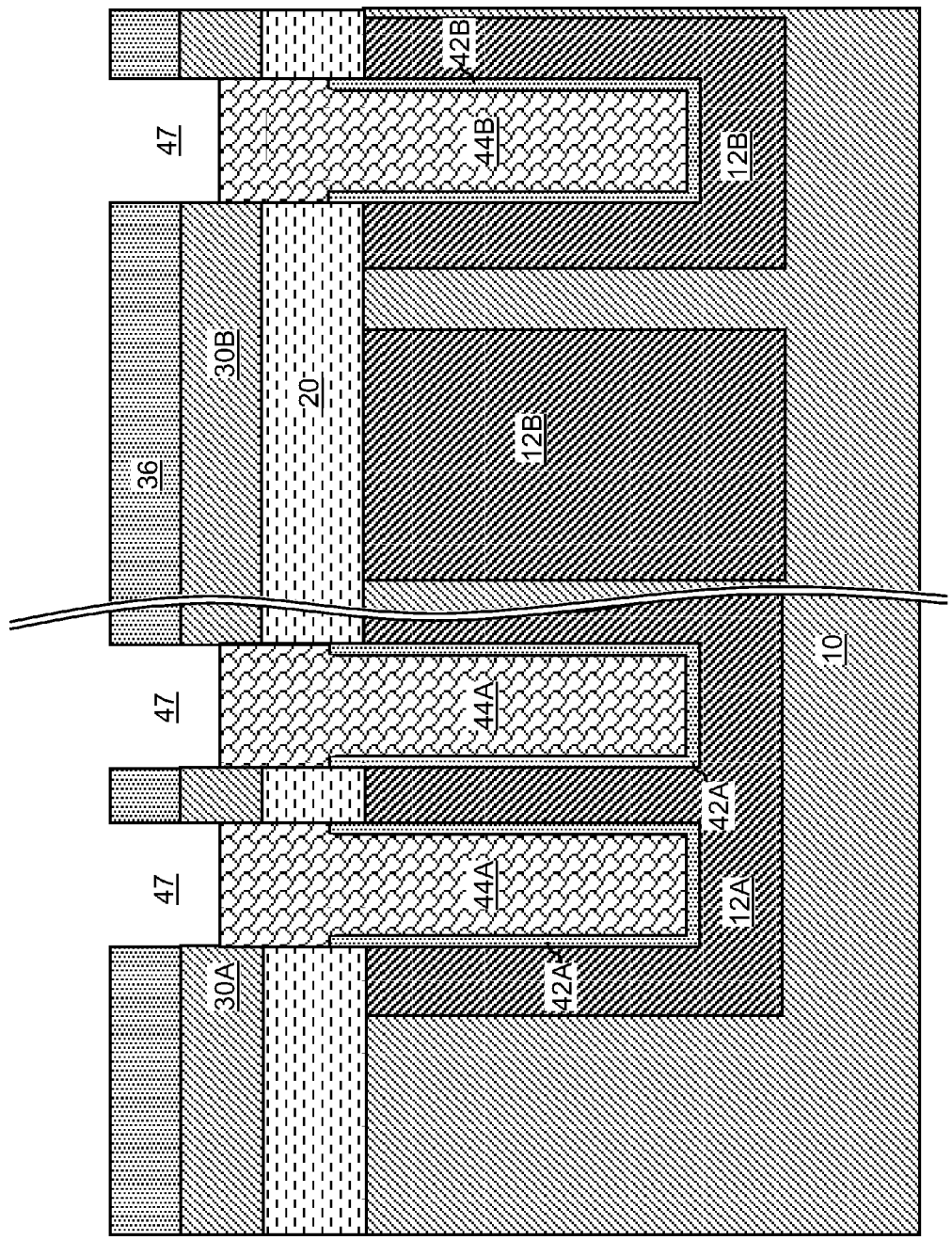
FIG. 4B is a vertical cross-sectional view of the first exemplary semiconductor structure along the vertical plane B-B' of FIG. 4A.

Referring to FIGS. 4A-4D, buried plates (12A, 12B) can be formed by doping a portion of the semiconductor material layer 10 in proximity of sidewalls of each trench (11A, 11B). First buried plates 12A can be formed in the first device region 100A, and second buried plates 12B are formed in the second device region 100B. Dopants can be introduced, for example, by outdiffusion from a dopant-including disposable material (such as a doped silicate glass) or by ion implantation as known in the art. Further, any other method of forming buried plates (12A, 12B) in the semiconductor material layer 10 can be employed in lieu of outdiffusion from a dopant-including disposable material or ion implantation.

In one embodiment, the buried plates (12A, 12B) can be doped with dopants of a second conductivity type, which is the opposite of the first conductivity type. For example, the first conductivity type can be p-type and the second conductivity type can be n-type, or vice versa. A p-n junction is formed between the remaining portion of the semiconductor material layer 10 and the buried plate (12A, 12B). The dopant concentration in the buried plate (12A, 12B) can be, for example, from $1.0 \times 10^{18}/cm^3$ to $2.0 \times 10^{21}/cm^3$, and typically from $5.0 \times 10^{18}/cm^3$ to $5.0 \times 10^{19}/cm^3$, although lesser and greater dopant concentrations can also be employed.

The first buried plates 12A and the second buried plates 12B can be simultaneously formed. Optionally, formation of second buried plates can be prevented by patterning a material layer that introduces dopants into the semiconductor material layer 10, or by preventing introduction of dopants of the second conductivity type from the second device region 100B by other means.

A contiguous dielectric material layer (not shown) including a dielectric material suitable for a node dielectric of a capacitor can be deposited conformally on all physically exposed sidewalls in the trenches (11A, 11B) and on the top surface of the mask layer 36. For example, the dielectric material can include at least one of silicon nitride and a dielectric metal oxide material such as high dielectric constant (high-k) gate dielectric material as known in the art. The dielectric material of the contiguous dielectric material layer can be removed from above the insulator layer 20, for example, by application of an organic material (such as a photoresist material), recessing of the organic material to a depth between the top surface and the bottom surface of the buried insulator layer 20, and removal of the physically exposed portions of the dielectric material. Removal of physically exposed portions of the contiguous dielectric material layer can be patterned by an etch, which can be a wet etch. For example, if the contiguous dielectric material layer includes silicon nitride, the physically exposed portions of the contiguous dielectric material layer can be removed by a wet etch employing hot phosphoric acid.

Each remaining portion of the contiguous dielectric material layer within a first trench 11A constitutes a node dielectric 42A. Each remaining portion of the contiguous dielectric material layer within a second trench 11B constitutes a dielectric material liner 42B. The node dielectrics 42A and the dielectric material liners 42B have the same thickness and the same composition. The topmost surfaces of the node dielectrics 42A and the dielectric material liners 42B can be between the bottom surface and the top surface of the insulator layer 20. The node dielectrics 42A and the dielectric material liners 42B can be formed simultaneously.

A conductive material can be deposited to fill each trench (11A, 11B) completely. The conductive material can be a metallic material or a doped semiconductor material. The metallic material can be an elemental metal such as W, Ti, Ta, Cu, or Al, or an ally of at least two elemental metals, or a conductive metallic nitride of at least one metal, or a conductive metallic oxide of at least one metal. The doped semiconductor material can be a doped elemental semiconductor material, a doped compound semiconductor material, or an alloy thereof. The conductive material can be deposited by physical vapor deposition (PVD), chemical vapor deposition (CVD), electroplating, electroless plating, or a combination thereof. The conductive material is deposited to a thickness that is sufficient to fill the trench (11A, 11B) completely.

Excess portions of the conductive material can be removed from above the top surface of the mask layer 36, for example, by chemical mechanical planarization. Subsequently, the conductive material can be vertically recessed to a level between the top surface of the insulator layer 20 and the top surface of the insulator layer 20 by a recess etch. The recess etch of the conductive material layer can employ an anisotropic etch such as a reactive ion etch, an isotropic etch such as a wet etch, or a combination thereof. The recess etch can be selective to the material of the node dielectrics 42A and the dielectric material liners 42B.

An inner electrode 44A including the conductive material is formed in each first trench 11A in the first device region 100A. The topmost surface of each inner electrode 44A can be substantially planar, and is located between the level of the top surface of first semiconductor fins 30A and the level of the bottom surface of the insulator layer 20. A surface is substantially planar if the planarity of the surface is limited by microscopic variations in surface height that accompanies semiconductor processing steps known in the art. Each inner electrode 44A can be in physical contact with sidewalls of two first semiconductor fins 44A. Each inner electrode 44A can contact the sidewalls of the insulator layer 20. A cavity 47 is formed above each inner electrode 44A.

A conductive material portion 44B including the conductive material is formed in each second trench 11B in the second device region 100B. The topmost surface of each conductive material portion 44B can be substantially planar, and is located between the level of the top surface of second semiconductor fins 30A and the level of the bottom surface of the insulator layer 20. Each conductive material portion 44B can be in physical contact with sidewalls of two second semiconductor fins 44B. Each conductive material portion 44B can contact the sidewalls of the insulator layer 20. A cavity 47 is formed above each conductive material portion 44B. The inner electrodes 44A and the conductive material portions 44B can be formed simultaneously.

Each set of a first buried plate (12A, 12B), a node dielectric 42A, and an inner electrode 44 constitute a trench capacitor (12A, 42A, 44A). Each first buried plate 12A is an outer node of the trench capacitor, each node dielectric 42A is a dielectric separating an outer electrode from an inner electrode of a trench capacitor, and each inner electrode 44 is an inner electrode of a trench capacitor. Each trench capacitor (12A, 42A, 44A) is embedded within the combination of the semiconductor material layer 10 and the insulator layer 20. The insulator layer 20 overlies the buried plates (12A, 12B).

Figure 5A:
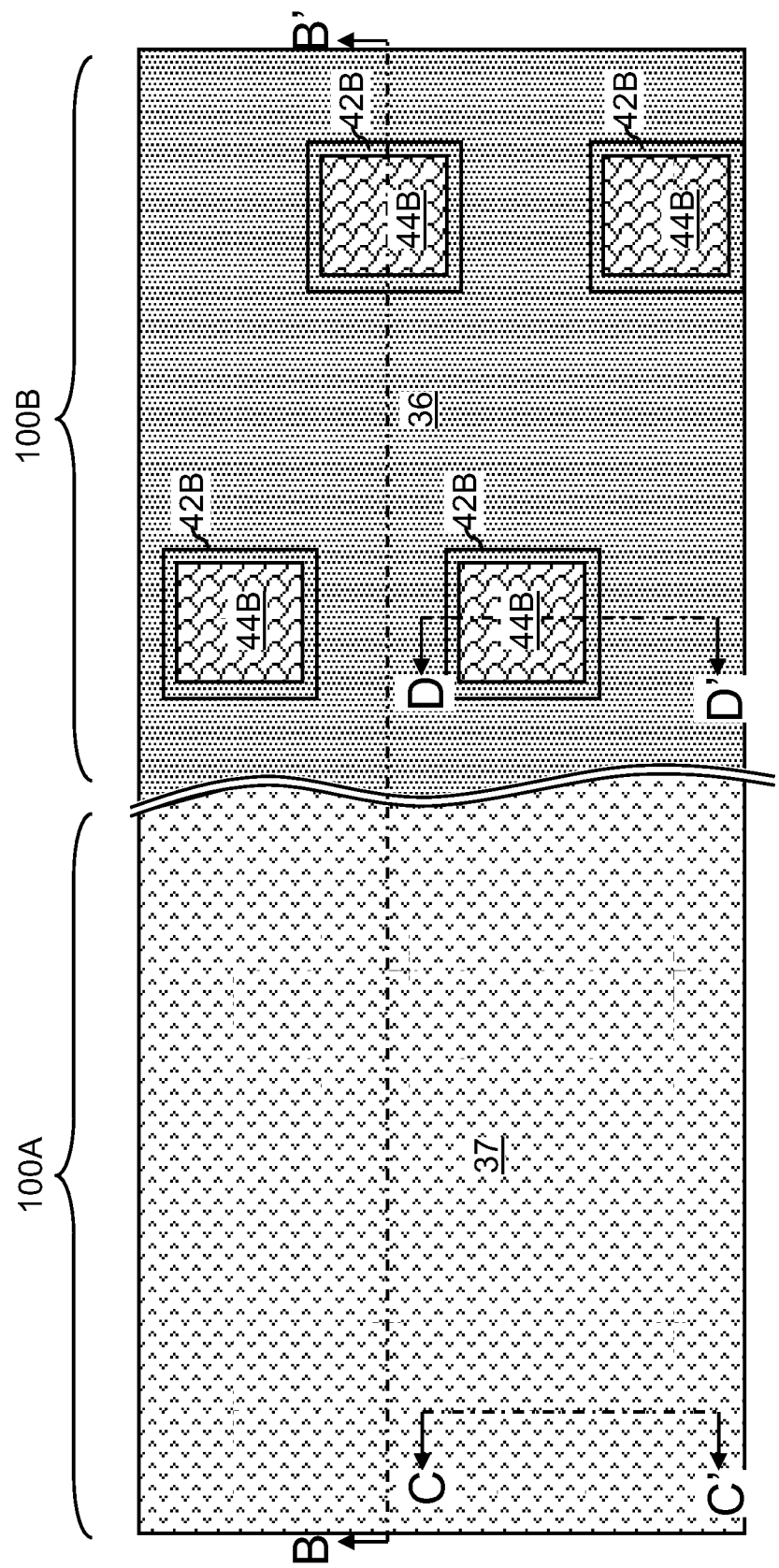
FIG. 5A is a top-down view of the first exemplary semiconductor structure after recessing conductive material portions in a logic device region according to the first embodiment of the present disclosure.
Figure 5B:
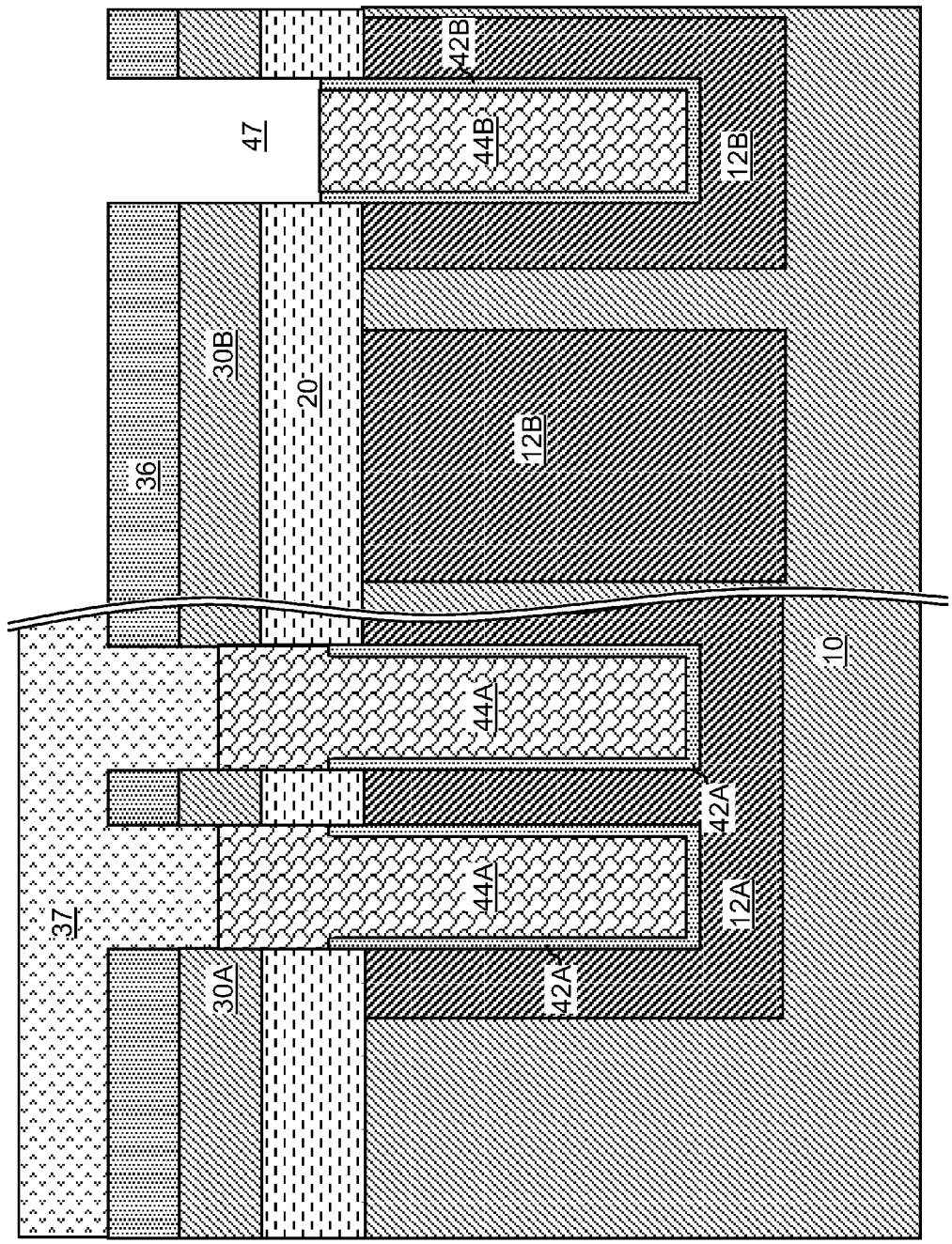
FIG. 5B is a vertical cross-sectional view of the first exemplary semiconductor structure along the vertical plane B-B' of FIG. 5A.

Referring to FIGS. 5A-5D, a photoresist layer 37 is applied over the first exemplary semiconductor structure and is lithographically patterned to cover the first device region 100A, while not covering the second device region 100B. Subsequently, the top surfaces of the conductive material portions 44B are recessed to a depth below the topmost surface of the insulator layer 20 by a recess etch, which can be an anisotropic etch or an isotropic etch. The photoresist layer 37 is subsequently removed, for example, by ashing.

Figure 6A:
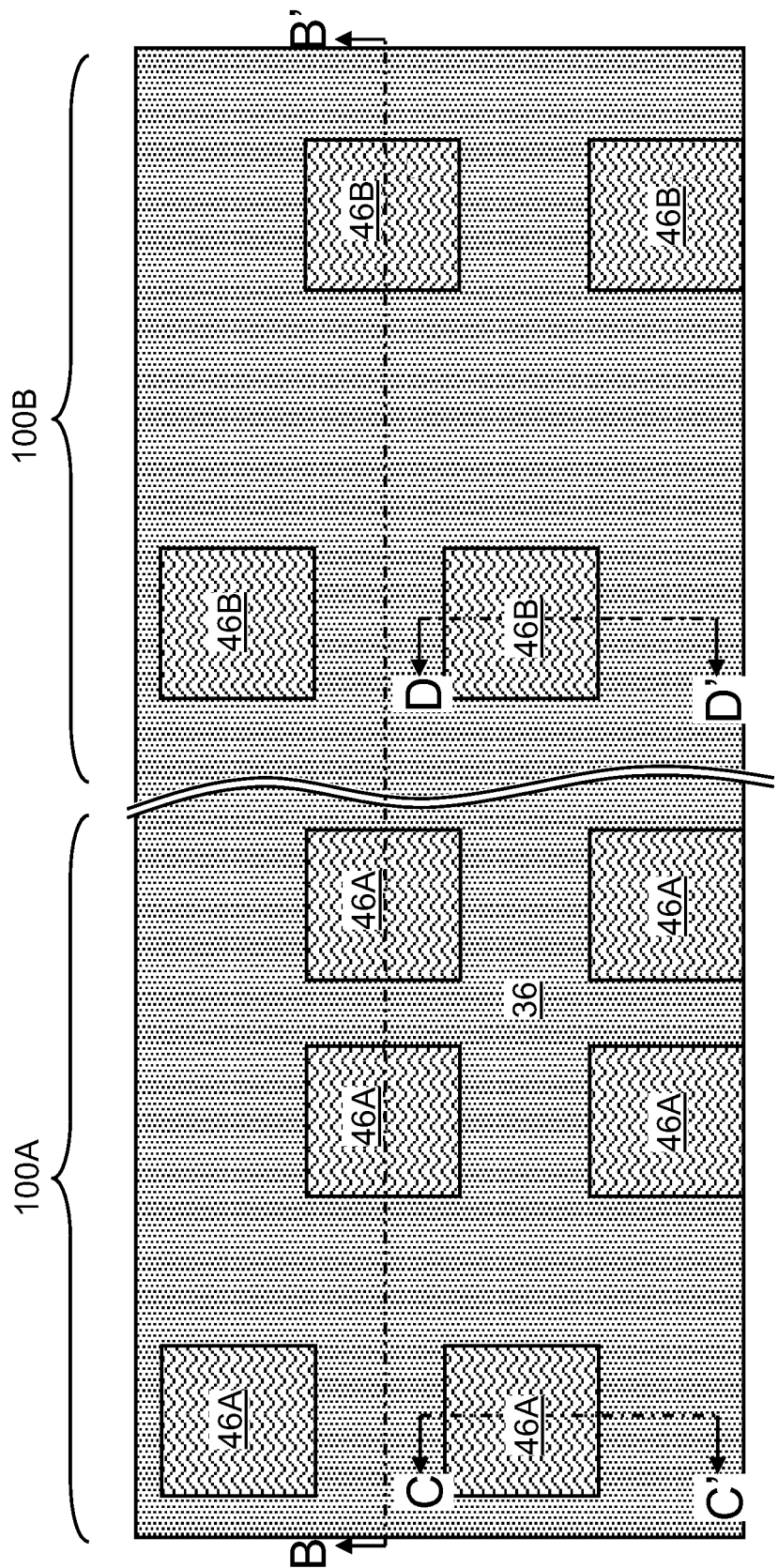
FIG. 6A is a top-down view of the first exemplary semiconductor structure after formation of trench top dielectric portions according to the first embodiment of the present disclosure.
Figure 6B:
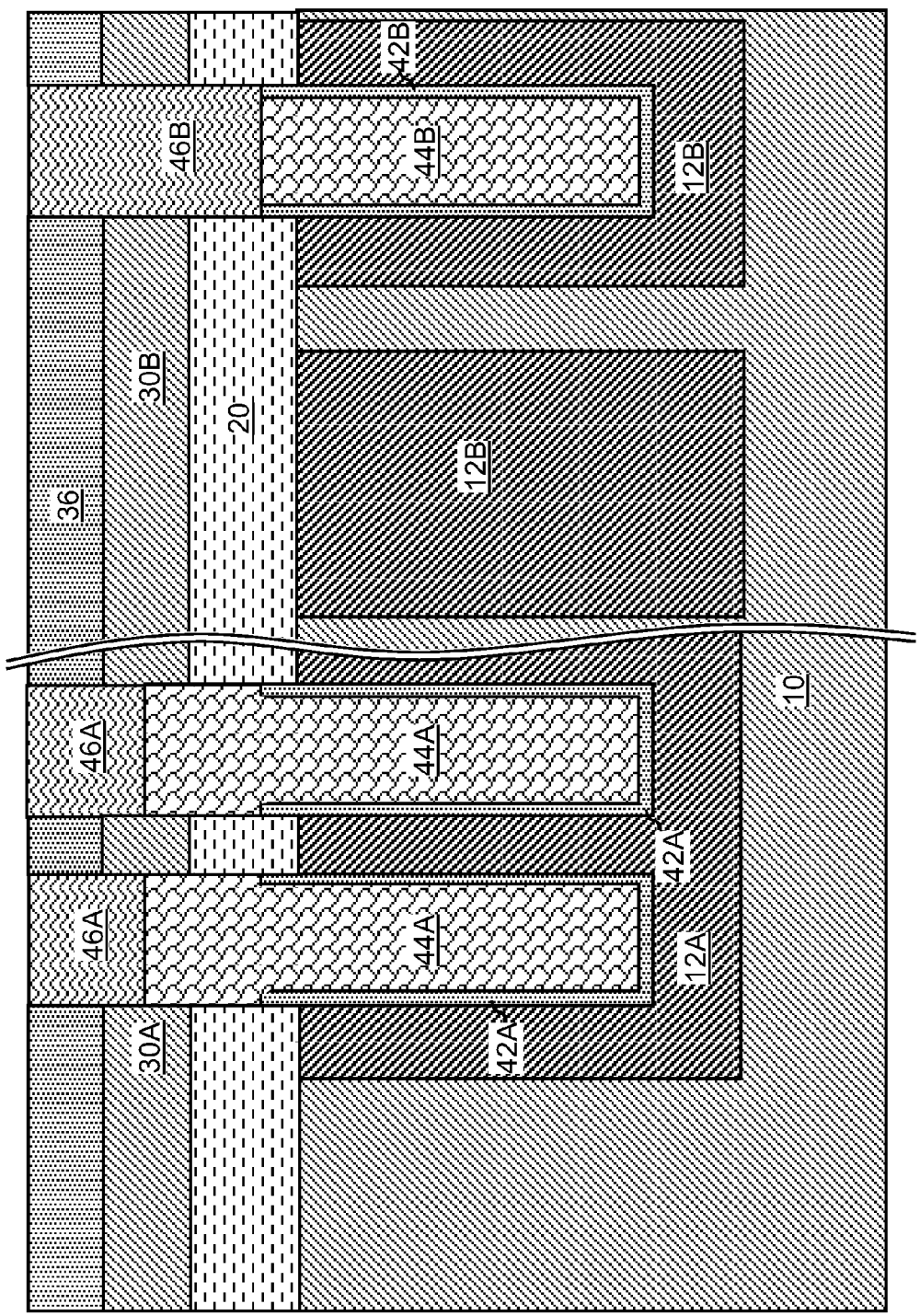
FIG. 6B is a vertical cross-sectional view of the first exemplary semiconductor structure along the vertical plane B-B' of FIG. 6A.
Figure 6C:
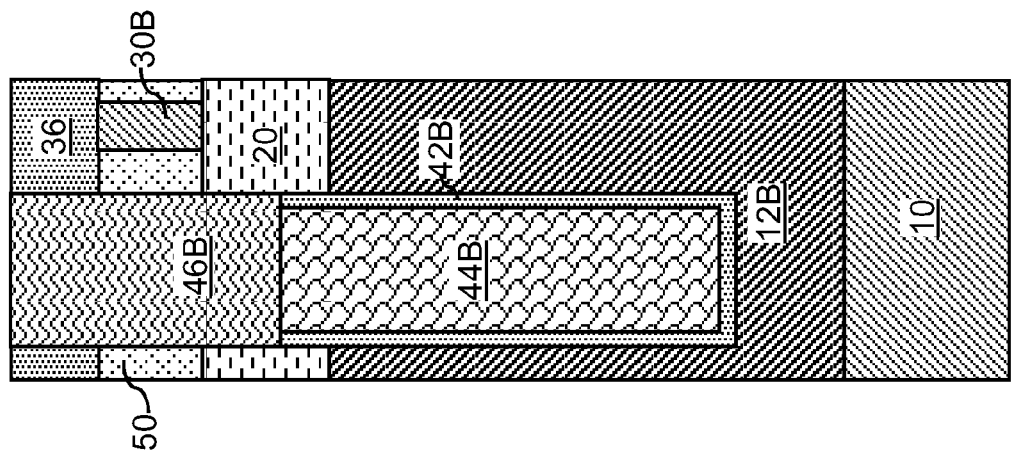
FIG. 6C is a vertical cross-sectional view of the first exemplary semiconductor structure along the vertical plane C-C' of FIG. 6A.
Figure 6D:
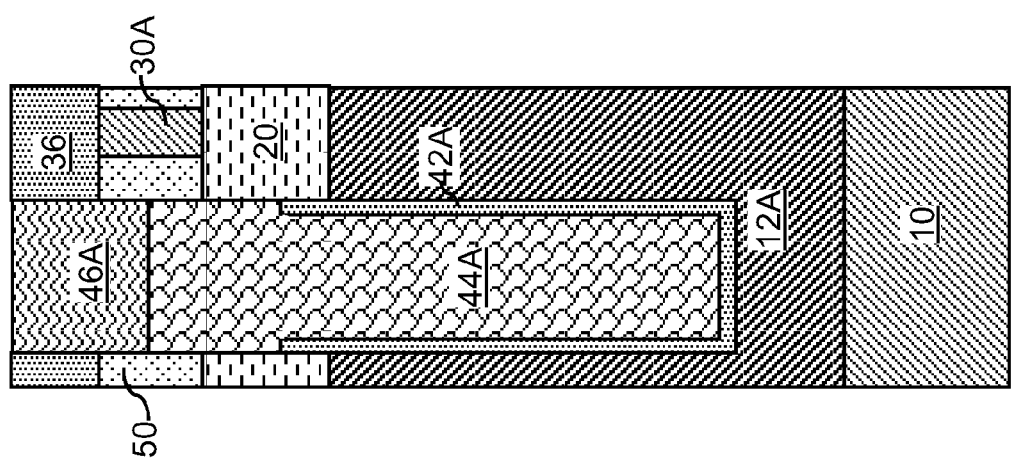
FIG. 6D is a vertical cross-sectional view of the first exemplary semiconductor structure along the vertical plane D-D' of FIG. 6A.

Referring to FIGS. 6A-6D, a dielectric material can be deposited within the cavities 47 in the first and second device regions (100A, 100B), and can be subsequently planarized employing the mask layer 36 as a stopping layer to remove excess portions of the deposited dielectric material from above the top surface of the mask layer 36. The dielectric material of the trench top dielectric portion 46 can be different from the dielectric material of the mask layer 36. For example, the dielectric material of the mask layer 36 can be silicon nitride, and dielectric material of the trench top dielectric portion 46 can be silicon oxide. The dielectric material of the trench top dielectric portion 46 can be deposited, for example, by chemical vapor deposition (CVD).

Each remaining portion of the deposited and planarized dielectric material in the first device region 100A constitutes a first trench top dielectric portion 46A. Each remaining portion of the deposited and planarized dielectric material in the second device region 100B constitutes a second trench top dielectric portion 46B. Top surfaces of the first and second trench top dielectric portions (46A, 46B) can be planar with the top surface of the mask layer 36.

Figure 7A:
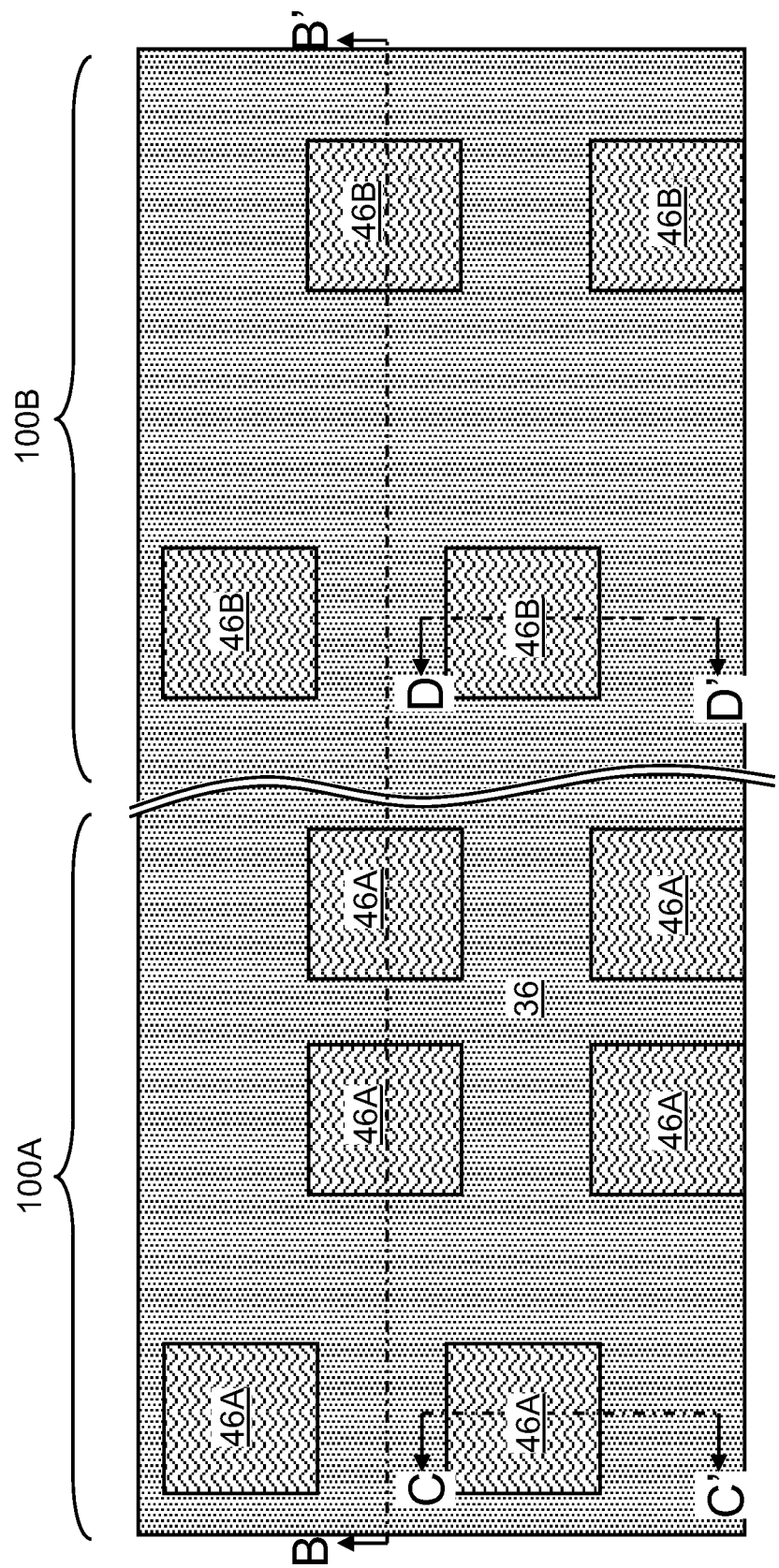
FIG. 7A is a top-down view of the first exemplary semiconductor structure after recessing of trench top dielectric portions according to the first embodiment of the present disclosure.
Figure 7B:
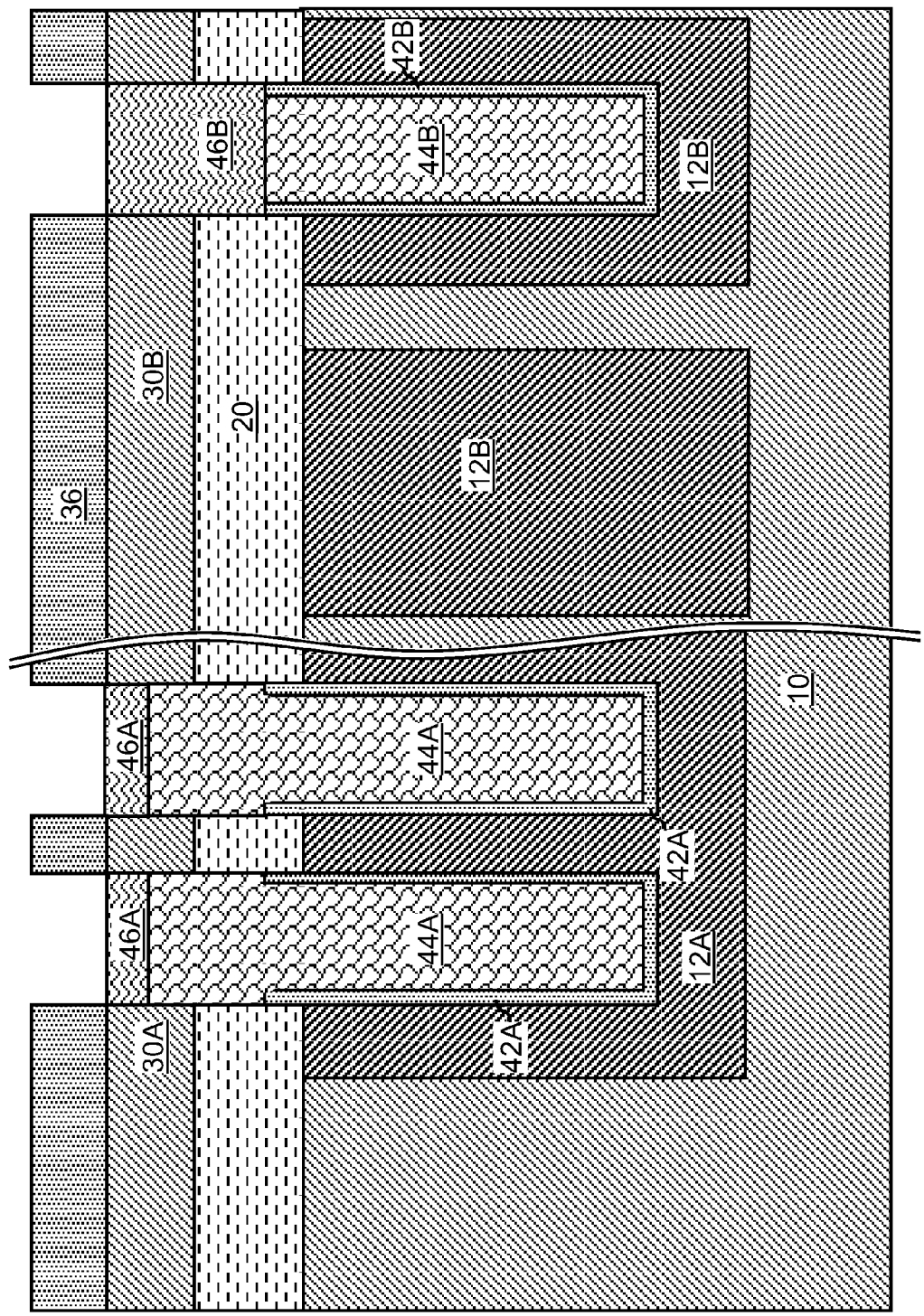
FIG. 7B is a vertical cross-sectional view of the first exemplary semiconductor structure along the vertical plane B-B' of FIG. 7A.

Referring to FIGS. 7A-7D, the first and second trench top dielectric portions (46A, 46B) can be recessed relative to the top surface of the mask layer 36 by a recess etch to a height about the top surface of the first and second semiconductor fins (30A, 30B). The recess etch can be selective to the material of the mask layer 36. The first and second trench top dielectric portions (46A, 46B) are thinned by the recess etch. In one embodiment, the dielectric material can be recessed to a height of a horizontal plane not higher than the top surfaces of the semiconductor fins (30A, 30B).

Figure 8A:
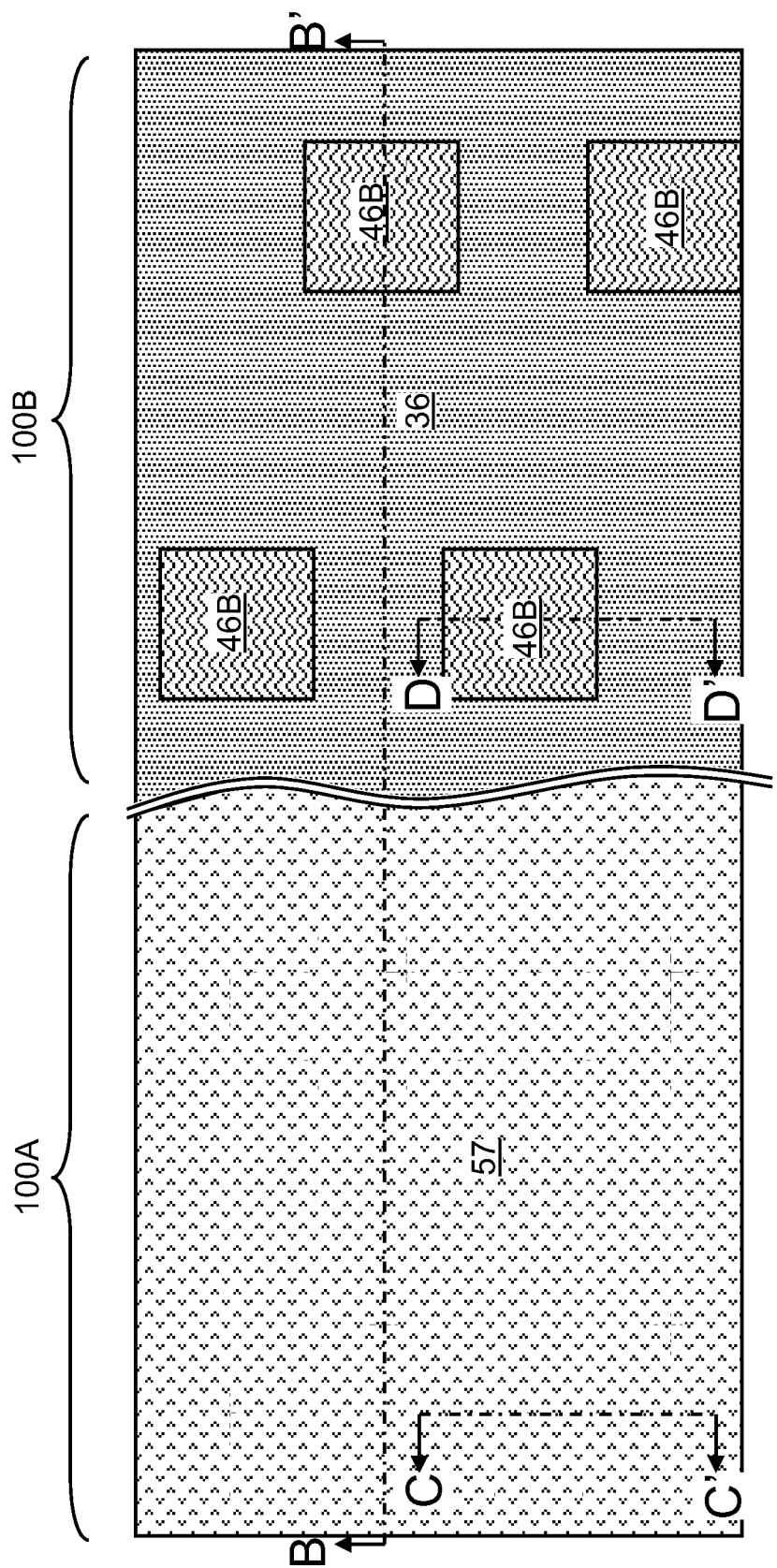
FIG. 8A is a top-down view of the first exemplary semiconductor structure after recessing of trench top dielectric portions in the logic device region according to the first embodiment of the present disclosure.
Figure 8B:
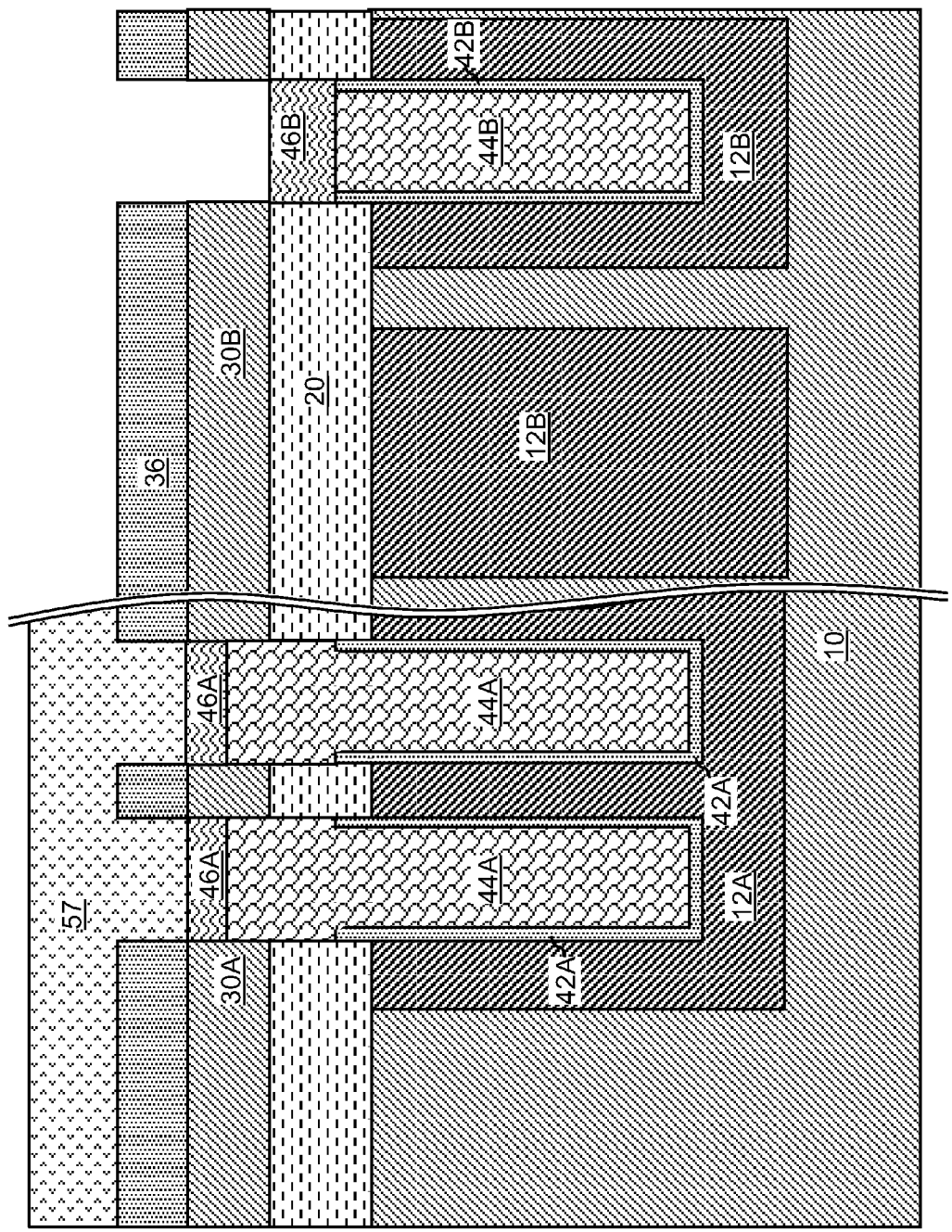
FIG. 8B is a vertical cross-sectional view of the first exemplary semiconductor structure along the vertical plane B-B' of FIG. 8A.

Referring to FIGS. 8A-8D, a photoresist layer 57 is applied over the first exemplary semiconductor structure and is lithographically patterned to cover the first device region 100A, while not covering the second device region 100B. Subsequently, the top surfaces of the second trench top dielectric portions 46B are recessed to a depth about the topmost surface of the insulator layer 20 by a recess etch, which can be an anisotropic etch or an isotropic etch. Thus, the top surfaces of the second trench top dielectric portions 46B as recessed are located below the horizontal plane including the top surfaces of the first trench top dielectric portions 46A. After recessing, the top surfaces of the second trench top dielectric portions 46B can be coplanar with, located above, or located below, the top surface of the insulator layer 20. The photoresist layer 57 is subsequently removed, for example, by ashing.

Figure 9A:
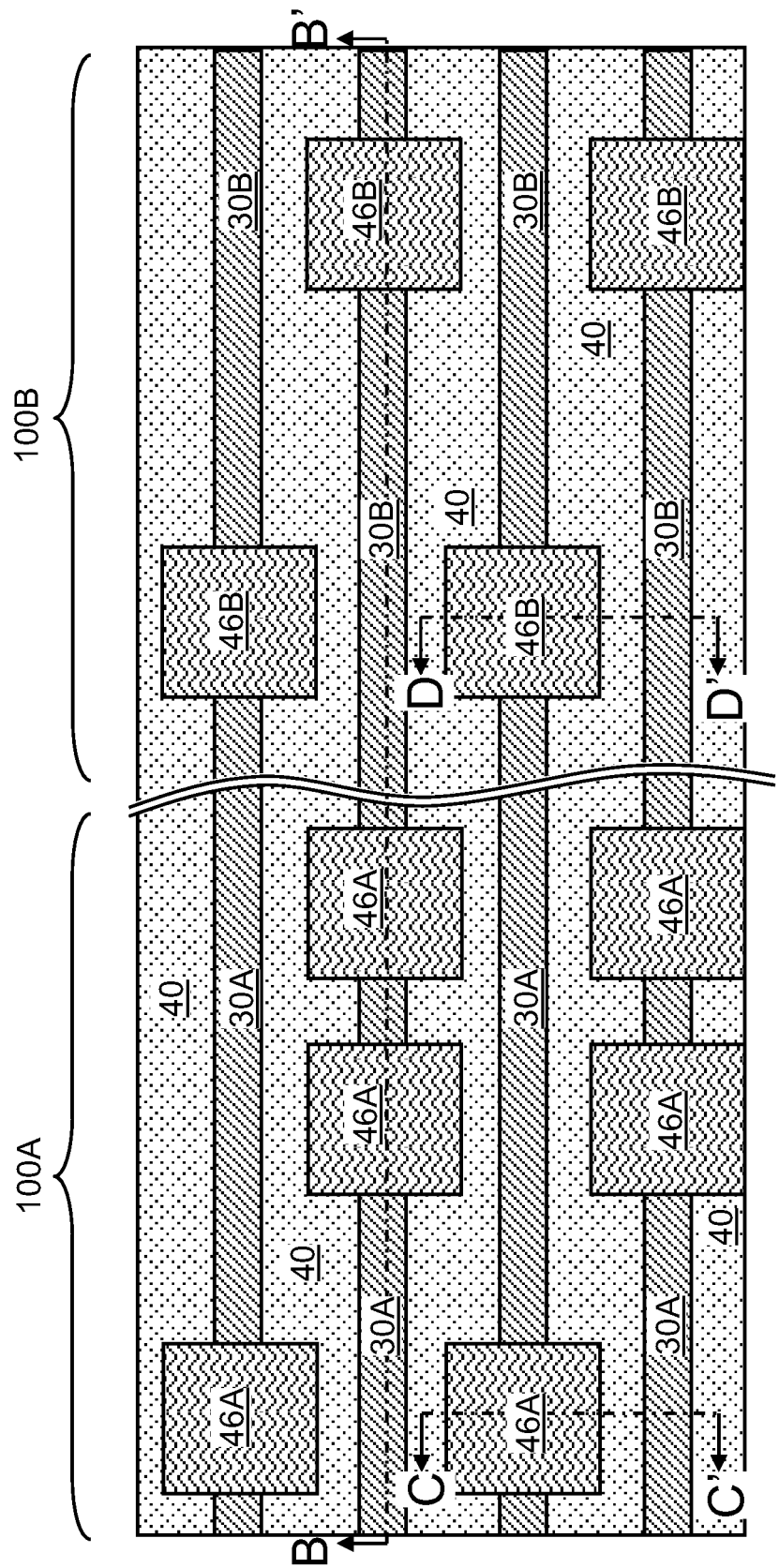
FIG. 9A is a top-down view of the first exemplary semiconductor structure after removal of a mask layer according to the first embodiment of the present disclosure.
Figure 9B:
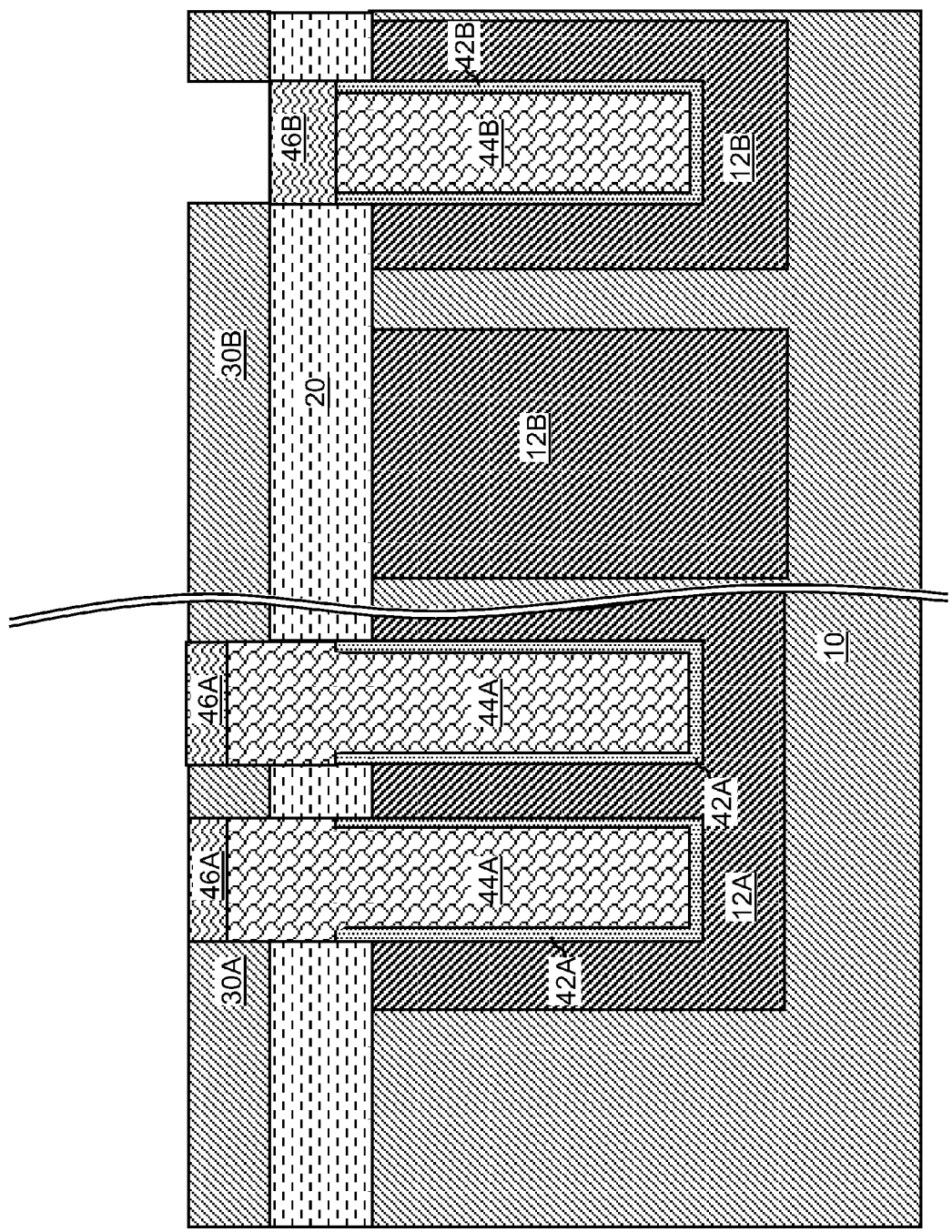
FIG. 9B is a vertical cross-sectional view of the first exemplary semiconductor structure along the vertical plane B-B' of FIG. 9A.
Figure 9C:
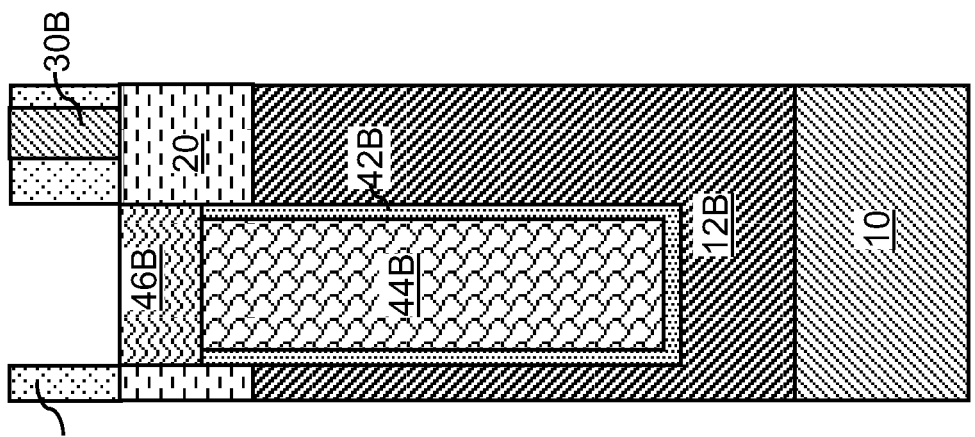
FIG. 9C is a vertical cross-sectional view of the first exemplary semiconductor structure along the vertical plane C-C' of FIG. 9A.
Figure 9D:
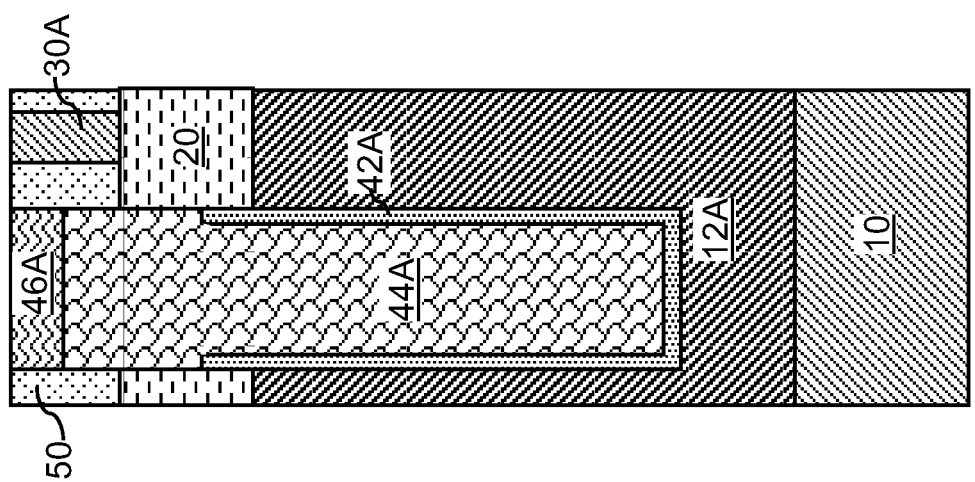
FIG. 9D is a vertical cross-sectional view of the first exemplary semiconductor structure along the vertical plane D-D' of FIG. 9A.

Referring to FIGS. 9A-9D, the mask layer 36 can be removed, for example, by a wet etch selective to the trench top dielectric portion 46 and the insulator layer 20. In one embodiment, the mask layer 36 can include silicon nitride, the trench top dielectric portion 46 and the insulator layer 20 include silicon oxide, and the removal of the mask layer 36 selective to the trench top dielectric portion 46 and the insulator layer 20 can be effected by a wet etch employing hot phosphoric acid.

Figure 10A:
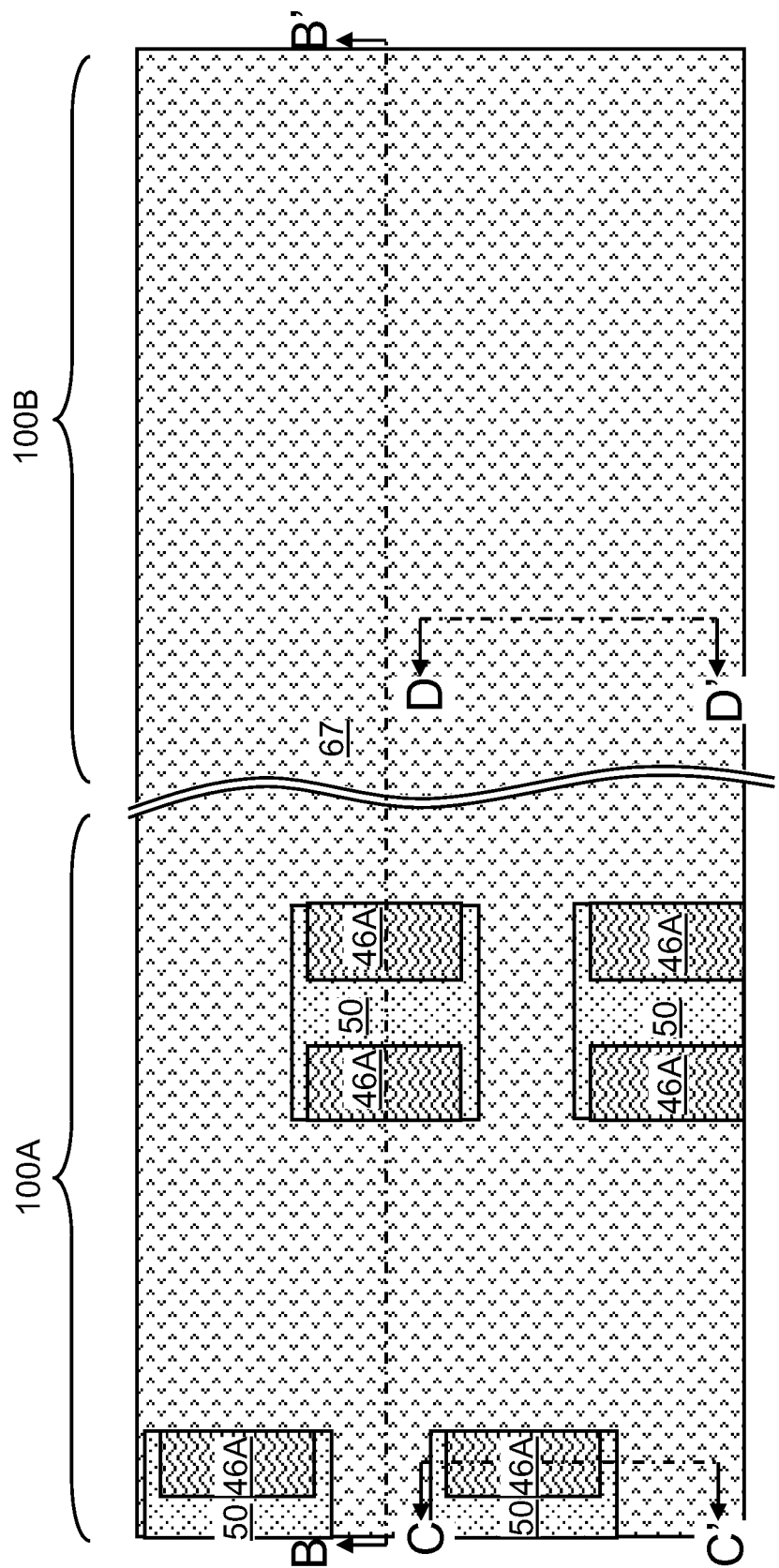
FIG. 10A is a top-down view of the first exemplary semiconductor structure after removal of portions of semiconductor fins within a memory device region according to the first embodiment of the present disclosure.
Figure 10B:
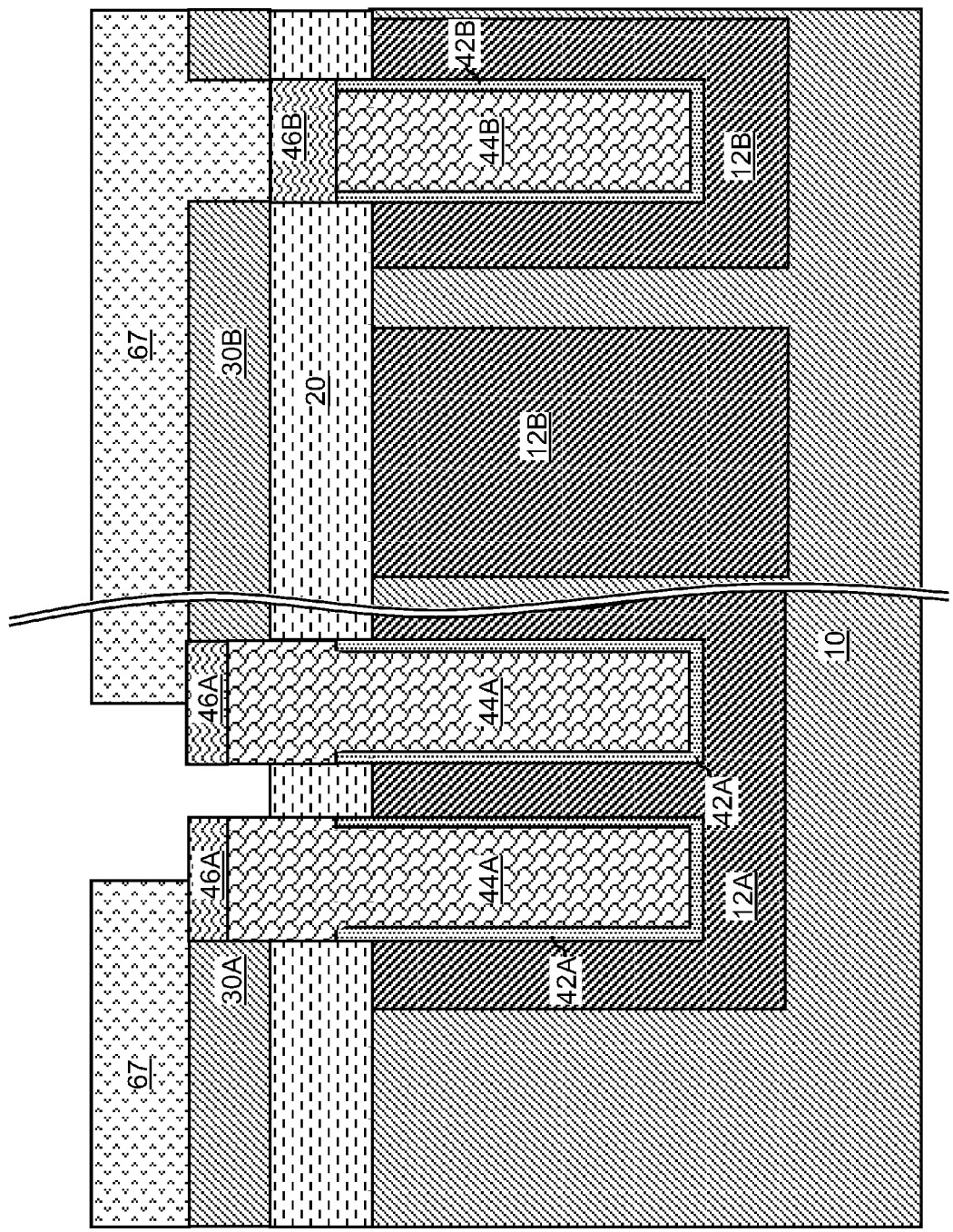
FIG. 10B is a vertical cross-sectional view of the first exemplary semiconductor structure along the vertical plane B-B' of FIG. 10A.

Referring to FIGS. 10A-10D, a photoresist layer 67 is applied over the first and second semiconductor fins (30A, 30B) and the disposable filler material layer 50, and is lithographically patterned to form openings in regions from which removal of portions of the semiconductor fins (100A, 100B) is desired. For example, if the trench capacitors (12A, 42A, 44A) are formed as pairs of two trench capacitors (12A, 42A, 44A) sharing a same first buried plate 12A, one of the openings can overlie a first semiconductor fin 30A laterally contacting the inner electrodes 44A of the pair of two trench capacitors (12A, 42A, 44A).

An etch process that is selective to the dielectric material of the first trench top dielectric portions 46A is performed to remove the physically exposed portions of the first semiconductor fins 30A. A top surface of the insulator layer 20 can be physically exposed within each opening in the photoresist layer 67. Physically exposed portions of the disposable fill material layer 50 may, or may not, be removed during the etch process. The photoresist layer 67 is subsequently removed, for example, by ashing.

Figure 11A:
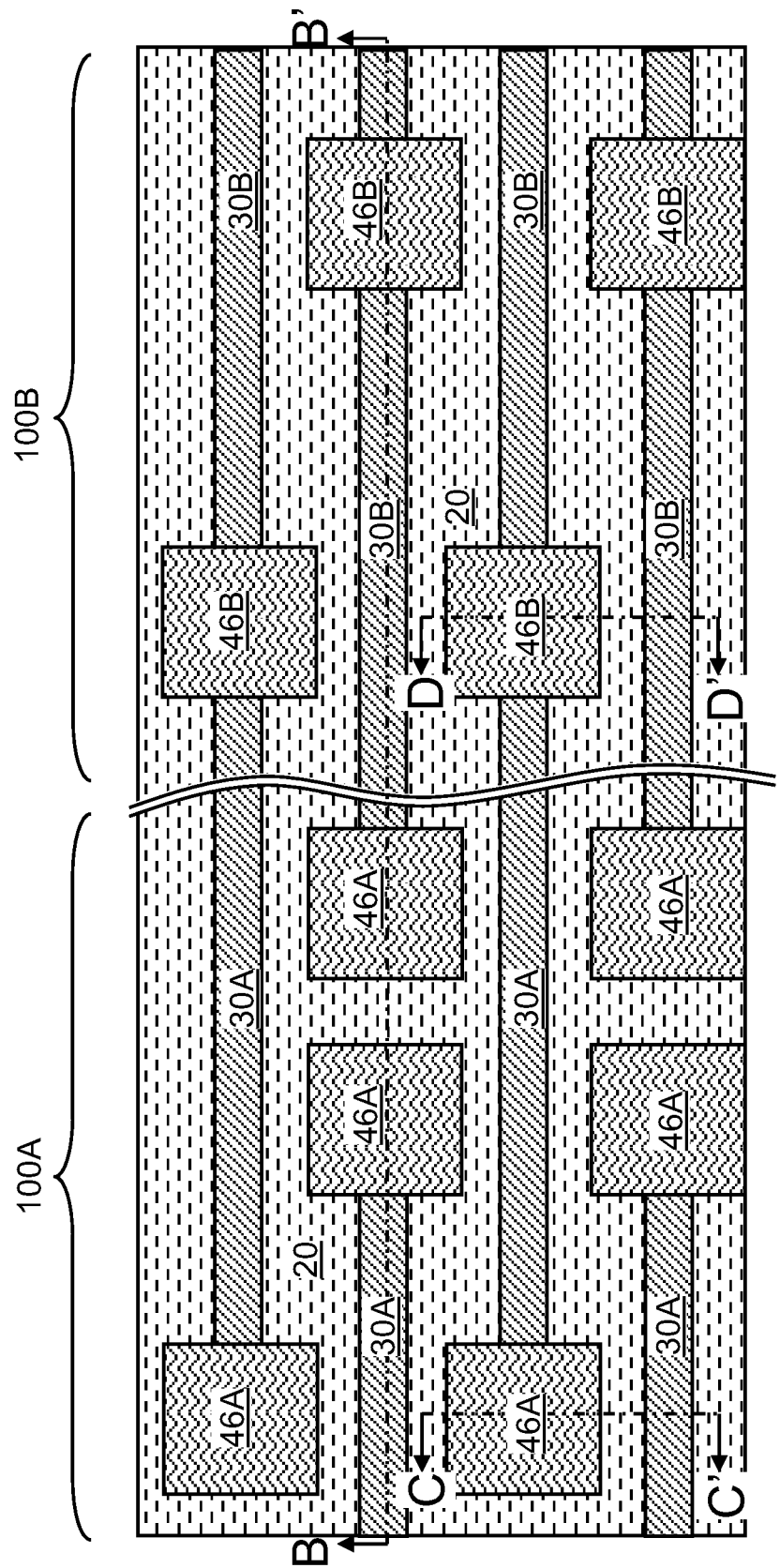
FIG. 11A is a top-down view of the first exemplary semiconductor structure after removal of the disposable filler material layer according to the first embodiment of the present disclosure.
Figure 11B:
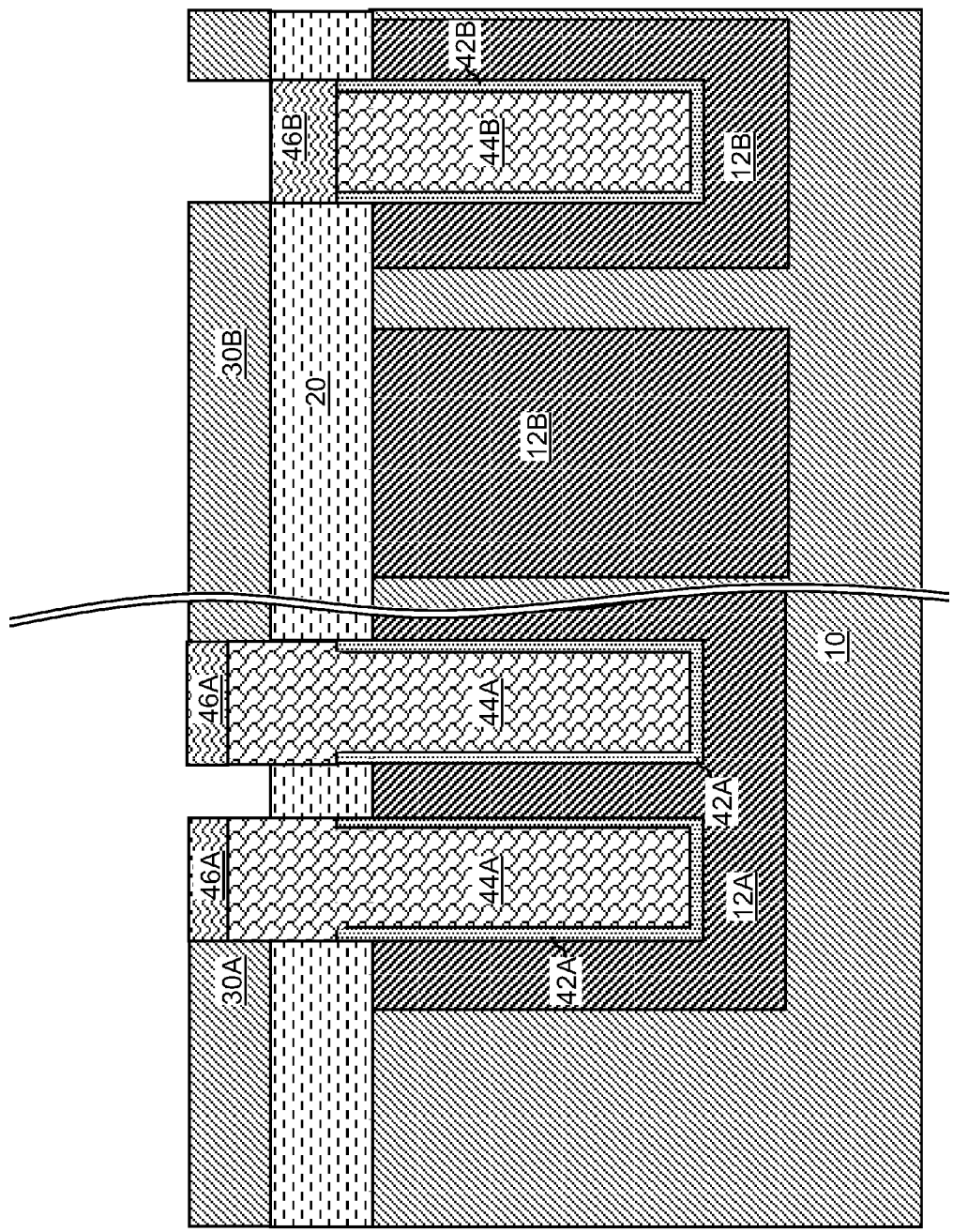
FIG. 11B is a vertical cross-sectional view of the first exemplary semiconductor structure along the vertical plane B-B' of FIG. 11A.
Figure 11C:
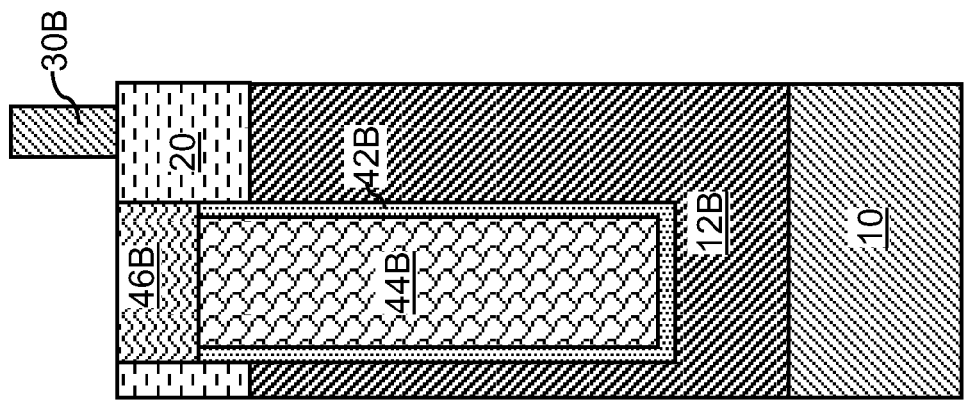
FIG. 11C is a vertical cross-sectional view of the first exemplary semiconductor structure along the vertical plane C-C' of FIG. 11A.
Figure 11D:
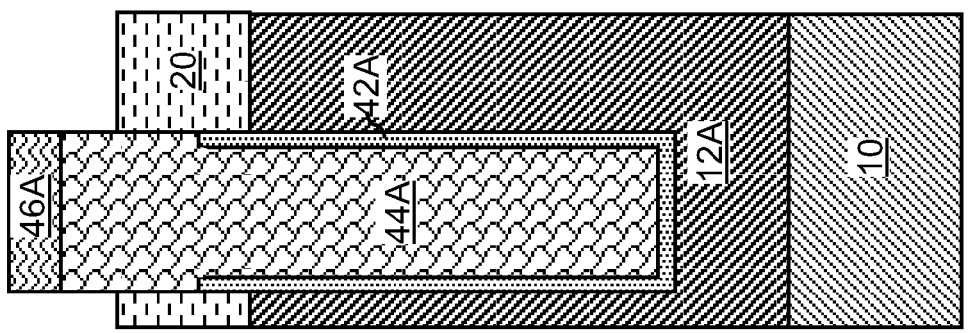
FIG. 11D is a vertical cross-sectional view of the first exemplary semiconductor structure along the vertical plane D-D' of FIG. 11A.

Referring to FIGS. 11A-11D, the disposable filler material layer 50 is removed selective to the semiconductor fins (30A, 30B), the trench top dielectric portions (46A, 46B), and the insulator layer 20. For example, if the disposable filler material layer 50 includes germanium, the semiconductor fins (30A, 30B) include silicon, and if the trench top dielectric portions (46A, 46B) and the insulator layer 20 include silicon oxide, the disposable filler material layer 50 can be removed by a wet etch employing ammonium hydroxide and hydrogen peroxide selective to the semiconductor fins (30A, 30B), the trench top dielectric portions (46A, 46B), and the insulator layer 20.

Figure 12A:
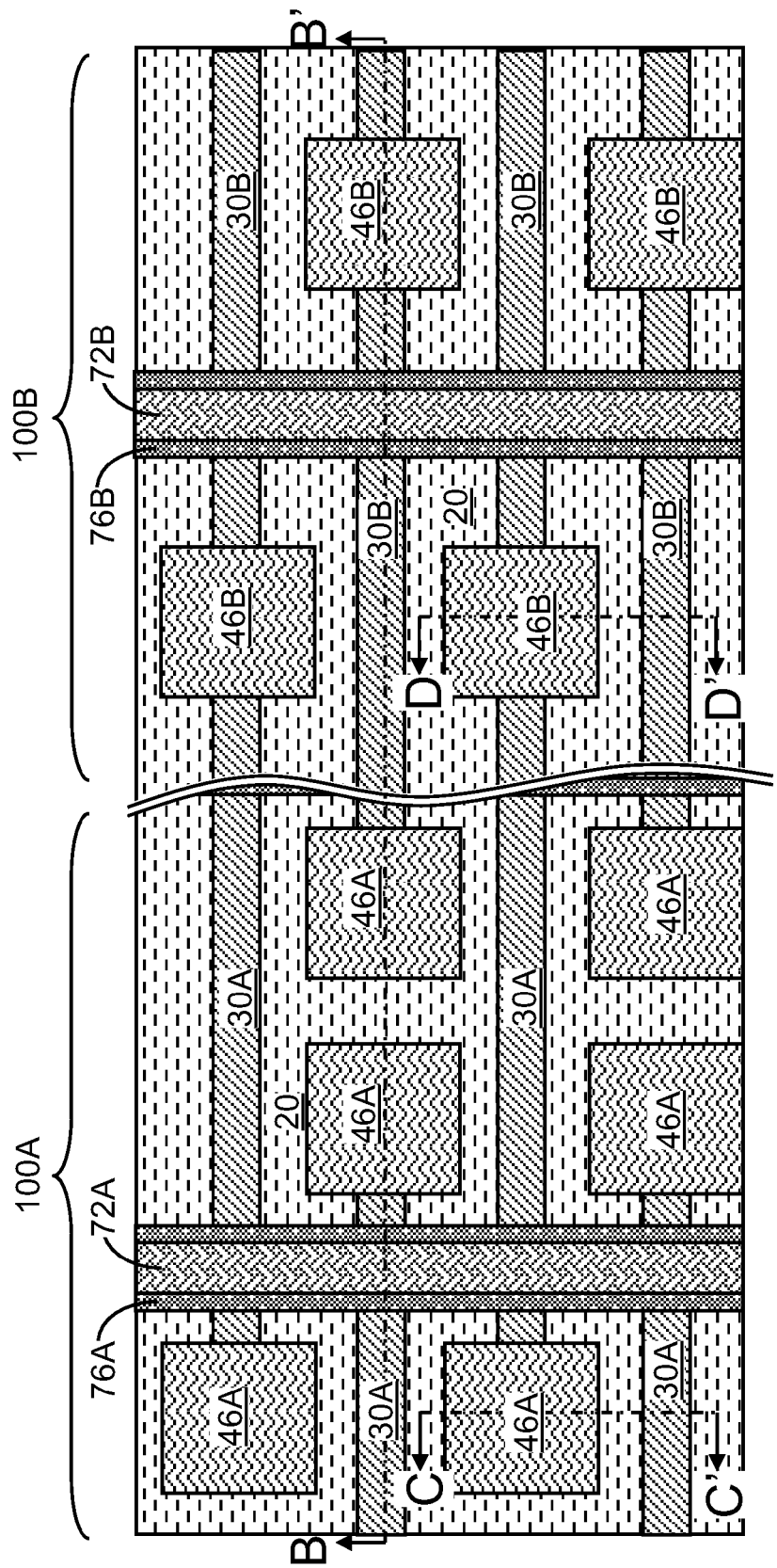
FIG. 12A is a top-down view of the first exemplary semiconductor structure after formation of gate structures, gate spacers, and a contact level dielectric layer according to the first embodiment of the present disclosure. The contact level dielectric layer is not shown in FIG. 12A for clarity.
Figure 12B:
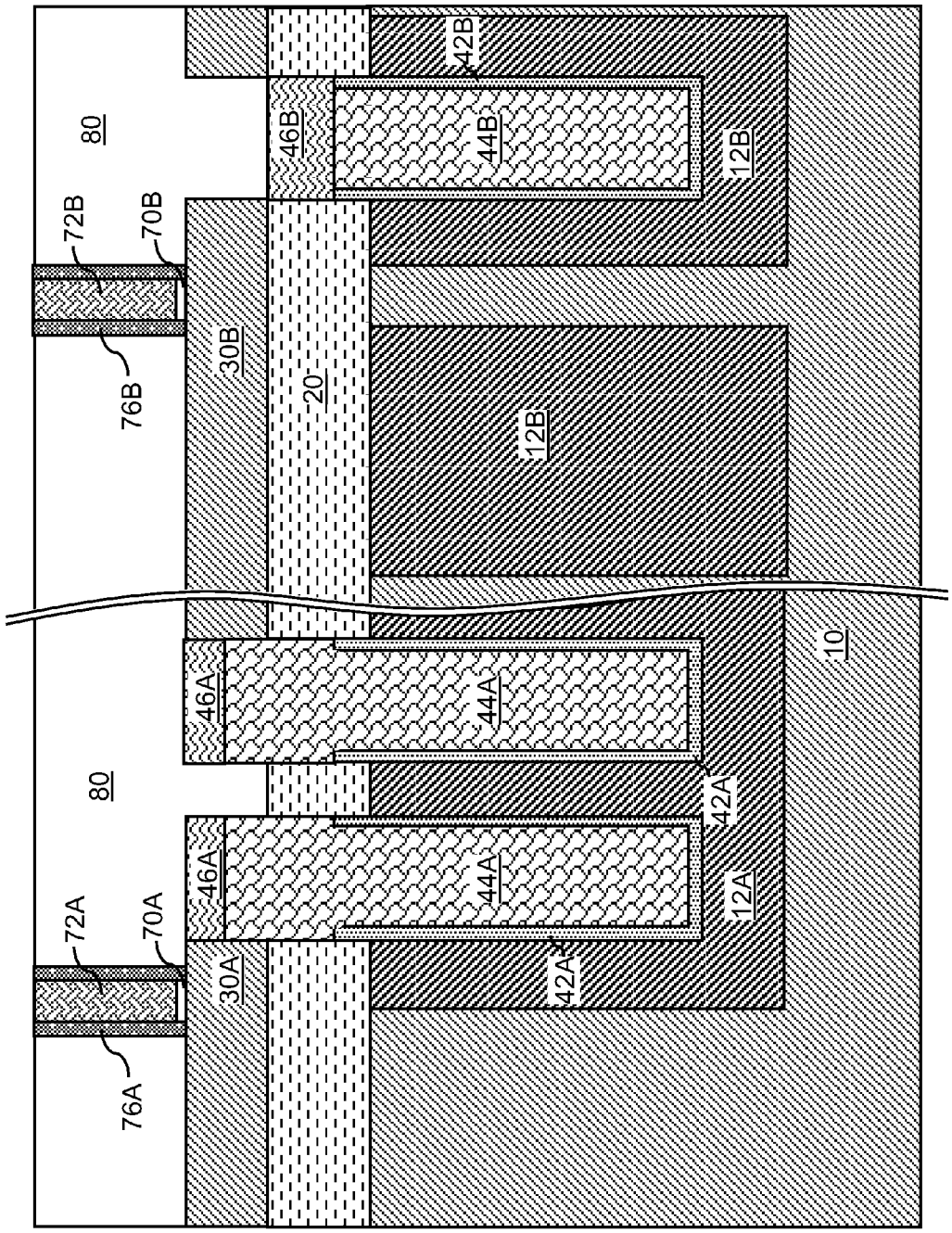
FIG. 12B is a vertical cross-sectional view of the first exemplary semiconductor structure along the vertical plane B-B' of FIG. 12A.

Referring to FIGS. 12A-12D, a stack of gate level layers can be deposited and lithographically patterned to form gate structures (70A, 72A, 70B, 72B). The gate level layers can include, for example, a gate dielectric layer and a gate conductor layer. The gate dielectric layer can be formed by conversion of surface portions of the semiconductor material of the semiconductor fins (30A, 30B), deposition of a dielectric material, or a combination thereof. The gate dielectric layer can include a dielectric semiconductor-containing compound (e.g., silicon oxide, silicon nitride, and/or silicon oxynitride) and/or a dielectric metal compound (e.g., dielectric metal oxide, dielectric metal nitride, and/or dielectric metal oxynitride). In general, the gate dielectric layer can be any dielectric material that can be employed as a gate dielectric of a field effect transistor as known in the art. The gate conductor layer includes a conductive material such as a doped semiconductor material and/or a metallic material. Optionally, the gate conductor layer can include a work function metal layer that tunes the threshold voltage of access transistor to be formed. Optionally, a gate cap layer (not shown) can be formed over the gate conductor layer.

The gate level layers can be patterned by a combination of lithography and etch to form various gate structures. The gate structures include first gate structures (70A, 72A) that straddle first semiconductor fins 30A and second gate structures (70B, 72B) that straddle second semiconductor fins 30B.

Each remaining portion of the gate dielectric layer within a first gate structure (70A, 72A) constitutes a first gate dielectric 70A, and each remaining portion of the gate dielectric layer within a second gate structure (70B, 72B) constitutes a second gate dielectric 70B. Each remaining portion of the gate conductor layer within a first gate structure (70A, 72A) constitutes a first gate electrode 72A, and each remaining portion of the gate conductor layer within a second gate electrode (70B, 72B) constitutes a second gate electrode 72B.

Portions of the first semiconductor fins 30A that underlie the first gate structures (70A, 72A) can correspond to the body regions of access field effect transistors to be subsequently formed for the trench capacitors (12A, 42A, 44A) in the first device region 100A. Portions of the second semiconductor fins 30B that underlie the second gate structures (70B, 72B) can correspond to the body regions of field effect transistors for a logic circuitry to be subsequently formed in the second device region 100A.

Source regions (not shown) and drain regions (not shown) can be formed by implanting electrical dopants, which can be p-type dopants or n-type dopants. The gate structures (70A, 72A, 70B, 72B) can be employed as mask structures during the ion implantation that forms the source regions and the drain regions. Unimplanted portions of the semiconductor fins (30A, 30B) constitute body regions.

Gate spacers (76A, 76B) can be simultaneously formed by depositing a conformal dielectric layer and anisotropically etching the conformal dielectric layer. In one embodiment, the conformal dielectric layer can include a dielectric material different from the dielectric material of the insulator layer 20 and the trench top dielectric portions (46A, 46B). For example, the conformal dielectric layer can include silicon nitride. The etch process that removes horizontal portions of the conformal dielectric layer can be prolonged after horizontal portions of the conformal dielectric layer are removed so that vertical portions of the conformal dielectric layer on sidewalls of the semiconductor fins (30A, 30B) are removed. Each remaining portion of the conformal dielectric layer around a gate structure (70A, 72A, 70B, 72B) is a gate spacer (76A, 76B). Each gate spacer (76A, 76B) laterally surrounds a gate structure (70A, 72A, 70B, 72B).

Optionally, additional electrical dopants can be implanted into the source regions and the drain regions of the semiconductor fins (30A, 30B) employing the combination of the gate structures (70A, 72A, 70B, 72B) and the gate spacers (76A, 76B) as an implantation mask.

Optionally, a selective epitaxy process can be performed to deposit a semiconductor material on physically exposed semiconductor surfaces. In this case, a raised source region (not shown) can be formed directly on each source region, and a raised drain region (not shown) can be formed directly on each drain region. Each raised source region can be epitaxially aligned to an underlying source region. Each raised drain region can be epitaxially aligned to an underlying drain region.

A planarization dielectric layer 80 is formed over the plurality of semiconductor fins (30A, 30B) and the gate structures (70A, 72A, 70B, 72B). The planarization dielectric layer 80 can be formed, for example, by spin-on coating or chemical vapor deposition (CVD) of a dielectric material. The planarization dielectric layer 80 may include a single dielectric material layer, or may include a plurality of dielectric material layers. Excess portions of the deposited dielectric material layer can be removed from above the horizontal plane including the top surface of the gate structures (70A, 72A, 70B, 72B), for example, by chemical mechanical planarization.

Optionally, the gate structures (70A, 72A, 70B, 72B) can be formed as disposable gate structures including a sacrificial material that can be removed selective to the material of the planarization dielectric layer 80 instead of being formed as functional gate structures that can function as gate electrodes and gate dielectrics of field effect transistors. In this case, the gate structures (70A, 72A, 70B, 72B) can be removed selective to the planarization dielectric layer 80 and the gate spacers (76A, 76B), and replaced with replacement gate structures. Each replacement gate structure can be a stack of a gate dielectric and a gate electrode in which the gate dielectric includes a high dielectric constant material as known in the art and the gate electrode includes a conductive material for a replacement gate electrode as known in the art.

The first exemplary semiconductor structure includes at least a dielectric material liner 42B located within a lower portion of a trench in a substrate (20, 12A, 12B, 10). Outer surfaces of the dielectric material liner 42B contacts surfaces of a second buried plate 12B including a doped semiconductor material and inner surfaces of the dielectric material liner 42B contact a conductive material portion 44B. The first exemplary semiconductor structure further includes a second trench top dielectric portion 46B located within an upper portion of the trench and contacting the dielectric material liner 42B and an entirety of a top surface of the conductive material portion 44B. An insulator layer 20 laterally contacts sidewalls of the second trench top dielectric portion 46B and the dielectric material liner 42B. The conductive material portion 44B is encapsulated by the dielectric material liner 42B and the second trench top dielectric portion 42B.

The first exemplary semiconductor structure further includes a second semiconductor fin 30B located on a top surface of the insulator layer 20. A widthwise sidewall of the second semiconductor fin 30B is vertically coincident with a sidewall of the second trench top dielectric portion 40B. A top surface of the second trench top dielectric portion 46B is located within a horizontal plane not higher than the top surface of the second semiconductor fin 30B, and not lower than the bottom surface of the insulator layer 20. The topmost surface of the dielectric material liner 42B can contact a bottom surface of the second trench top dielectric portion 46B. An inner sidewall of the dielectric material liner 42B can contact a sidewall of the second trench top dielectric portion 46B.

The first exemplary semiconductor structure can further include a trench capacitor (12A, 42A, 44A) embedded within the substrate (20, 12A, 12B, 10). A node dielectric 42A of the trench capacitor (12A, 42A, 44A) includes the same material as the dielectric material liner 42A. The inner electrode 44A of the trench capacitor (12A, 42A, 44A) includes the same material as the conductive material portion 44B, and an outer electrode of the trench capacitor is a first buried plate 12A including the same material as the second buried plate 12B.

An inner electrode of the trench capacitor (12A, 42A, 44A) contacts a sidewall of the insulator layer 20. A first semiconductor fin 30A is located on the top surface of the insulator layer 20, and laterally contacts an inner electrode 44A of the trench capacitor (12A, 42A, 44A). A first trench top dielectric portion 46A contacts the top surface of an inner electrode 44A of the trench capacitor (12A, 42A, 44A). The top surface of the first trench top dielectric portion 46A can be located within a horizontal plane located above the horizontal plane that includes the top surface of the second trench top dielectric portion 46B.

Figure 13A:
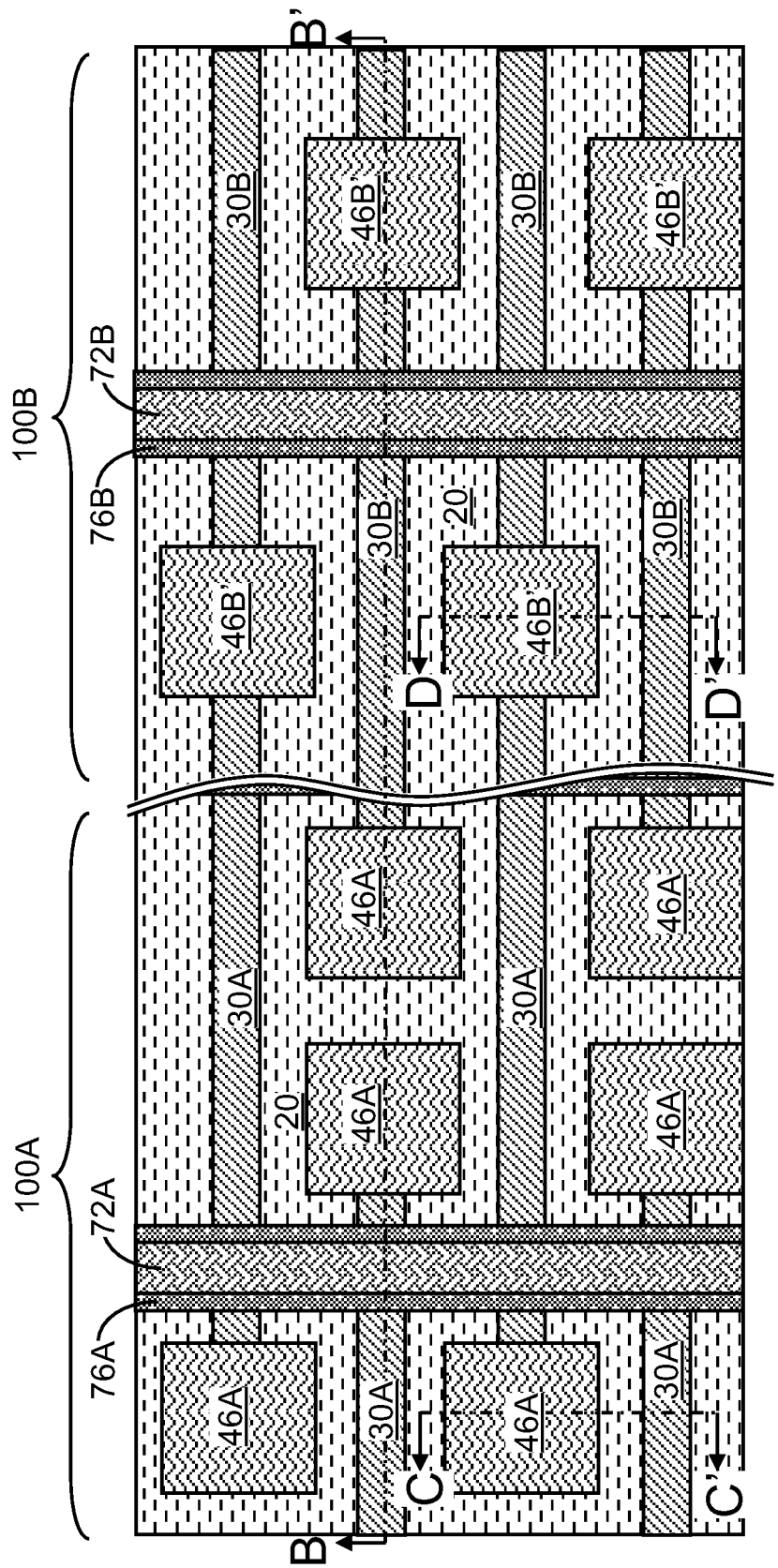
FIG. 13A is a top-down view of a second exemplary semiconductor structure according to a second embodiment of the present disclosure.
Figure 13B:
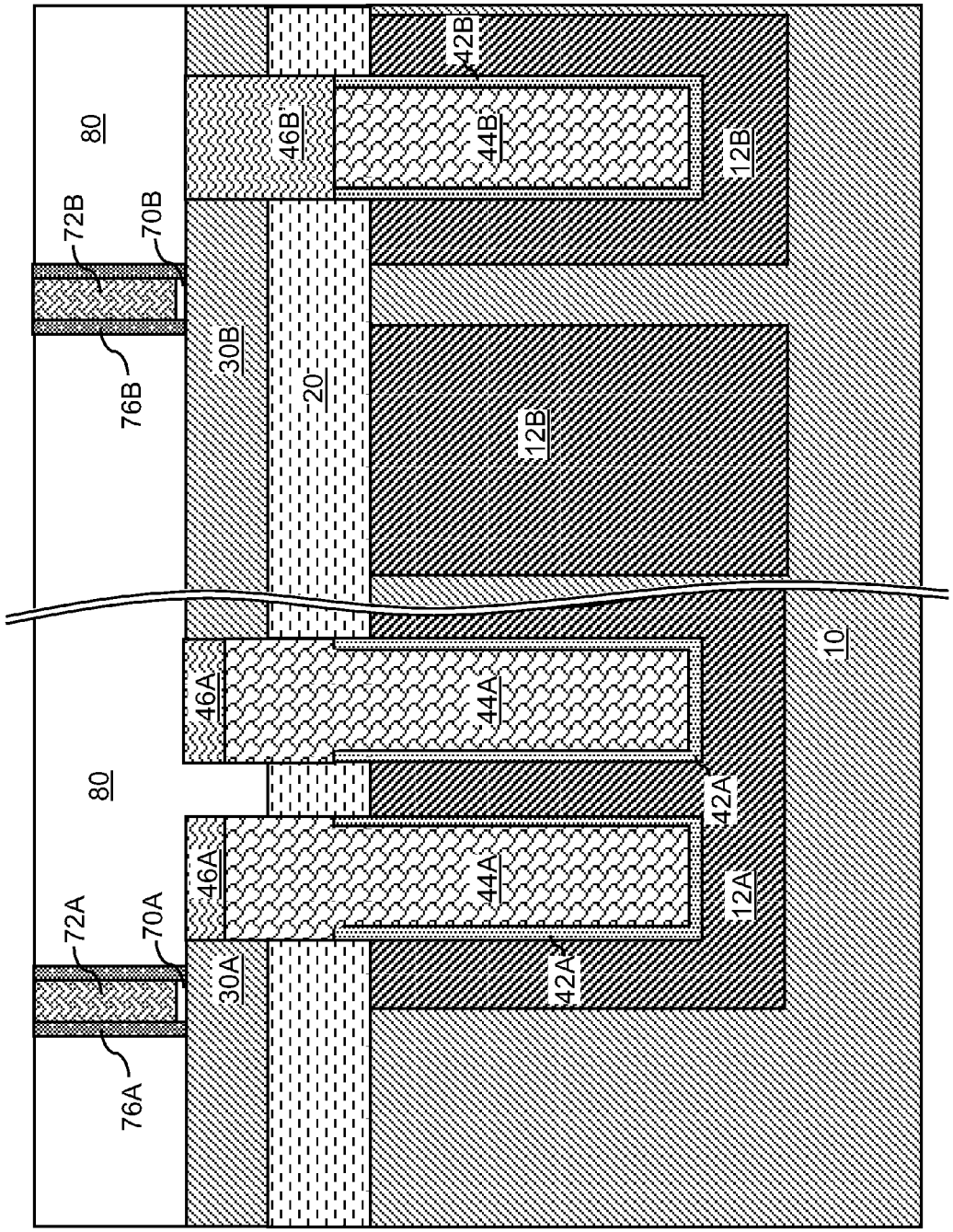
FIG. 13B is a vertical cross-sectional view of the second exemplary semiconductor structure along the vertical plane B-B' of FIG. 13A.
Figure 13C:
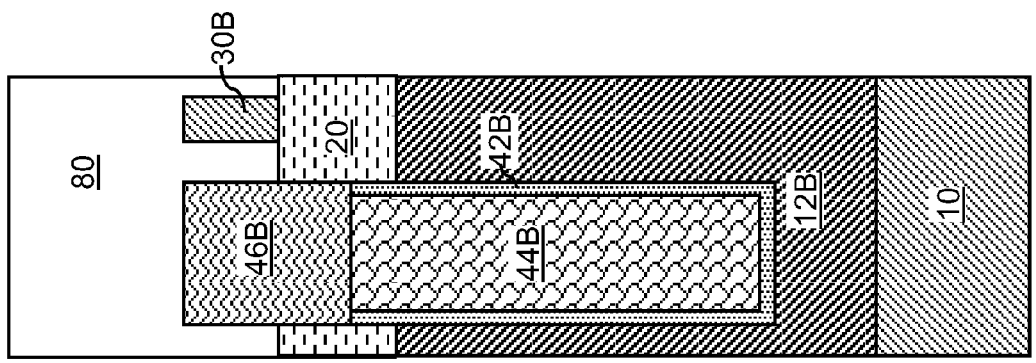
FIG. 13C is a vertical cross-sectional view of the second exemplary semiconductor structure along the vertical plane C-C' of FIG. 13A.
Figure 13D:
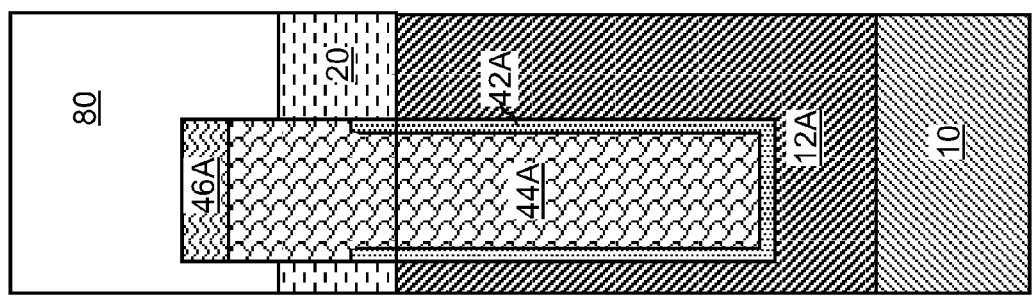
FIG. 13D is a vertical cross-sectional view of the second exemplary semiconductor structure along the vertical plane D-D' of FIG. 13A.

Referring to FIGS. 13A-13D, a second exemplary semiconductor structure according to a second embodiment of the present disclosure can be derived from the first exemplary semiconductor structure by omitting the processing steps of FIGS. 8A-8D and 9A-9D. In this case, the top surface of the first trench top dielectric portion 46A can be located within the same horizontal plane as the top surface of the second trench top dielectric portion 46B. In one embodiment, entire surfaces of two widthwise sidewalls of the second semiconductor fins 30B can be in physical contact with sidewalls of a second trench top dielectric portion 46B.

Figure 14A:
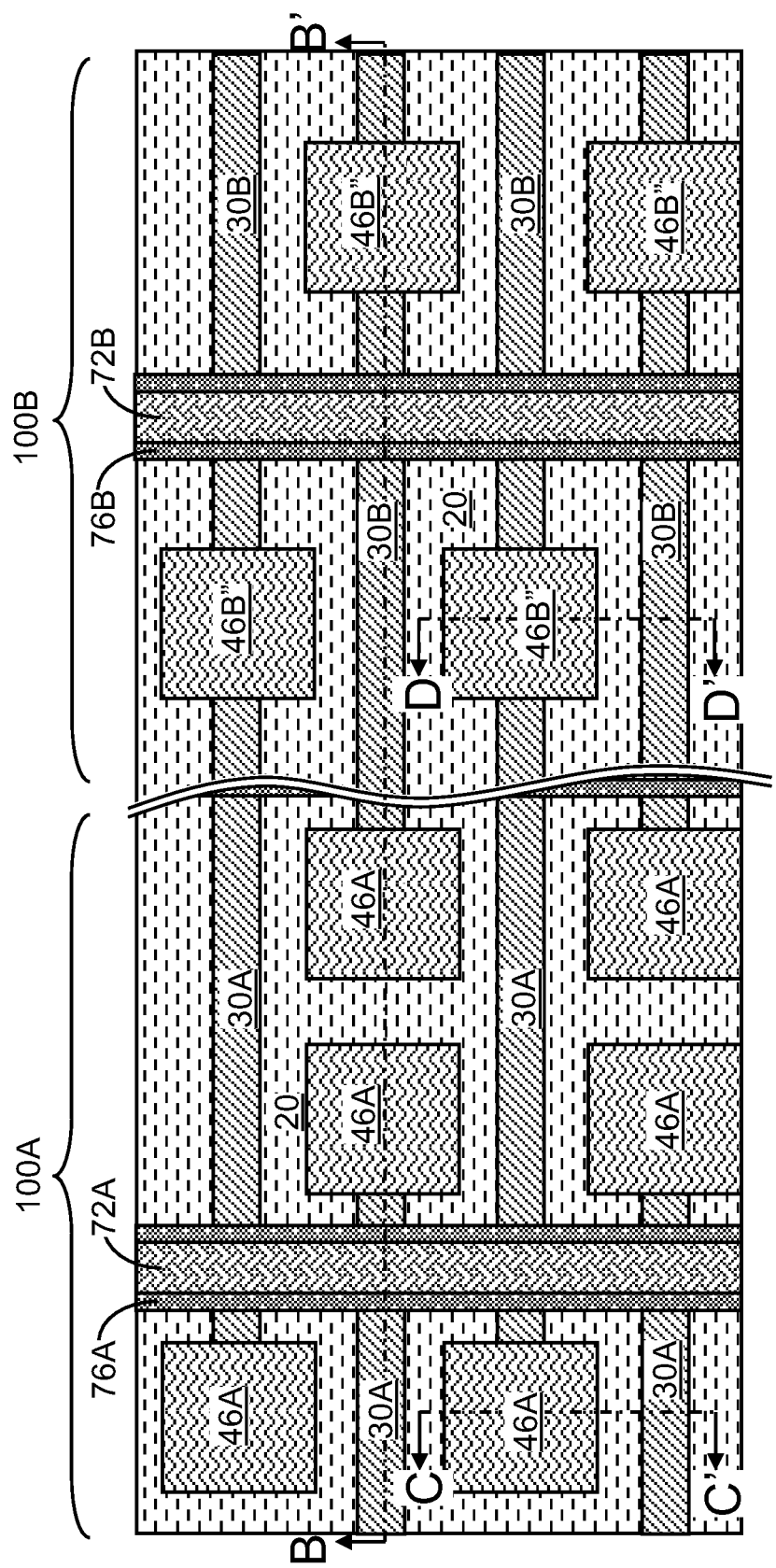
FIG. 14A is a top-down view of a third exemplary semiconductor according to a third embodiment of the present disclosure.
Figure 14B:
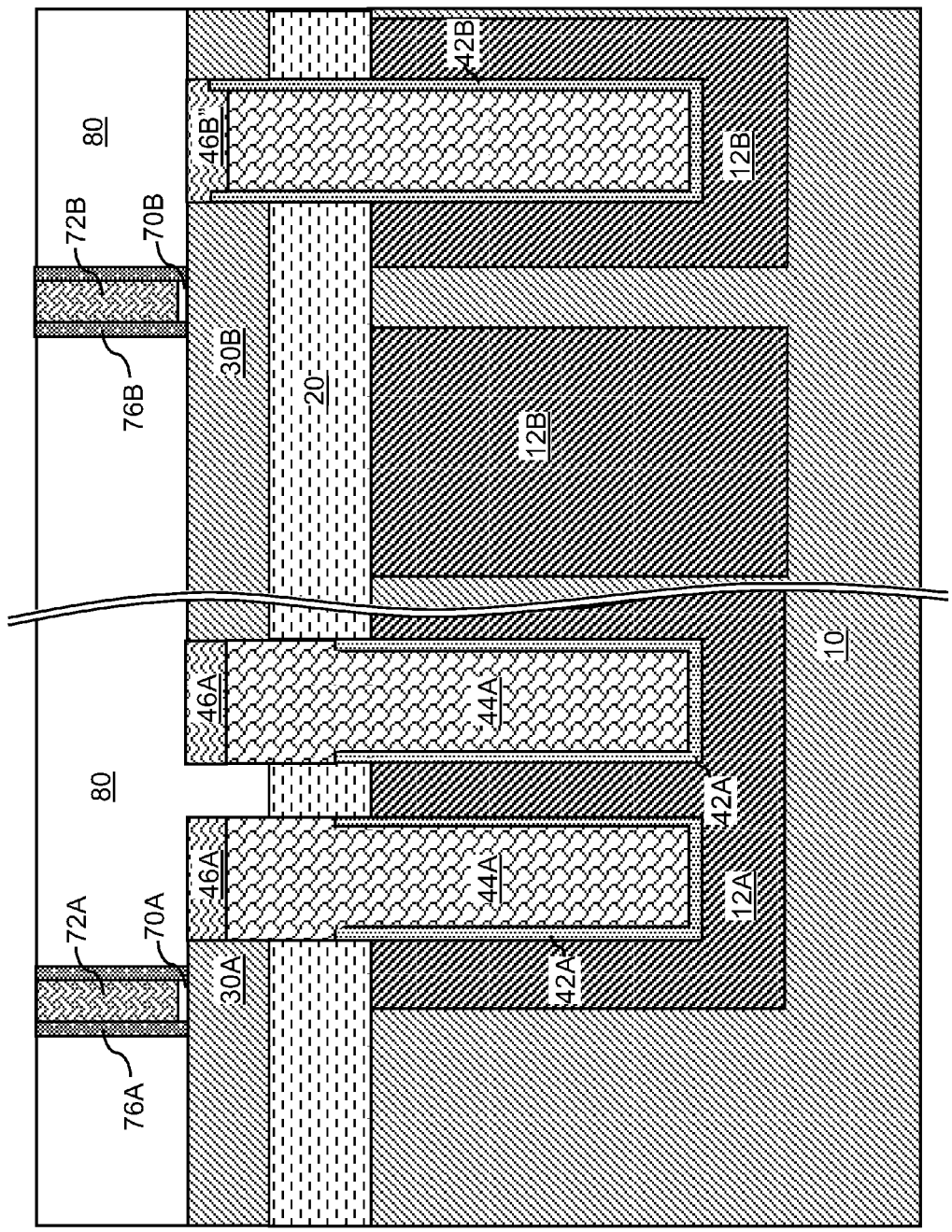
FIG. 14B is a vertical cross-sectional view of the third exemplary semiconductor structure along the vertical plane B-B' of FIG. 14A.
Figure 14C:
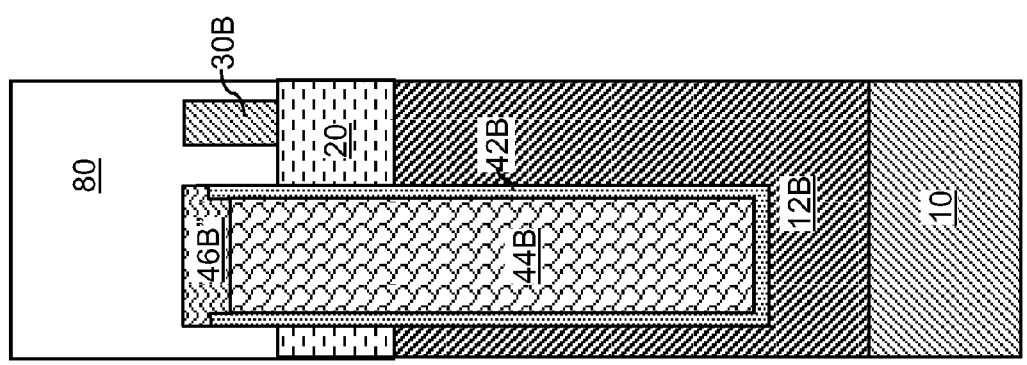
FIG. 14C is a vertical cross-sectional view of the third exemplary semiconductor structure along the vertical plane C-C' of FIG. 14A.
Figure 14D:
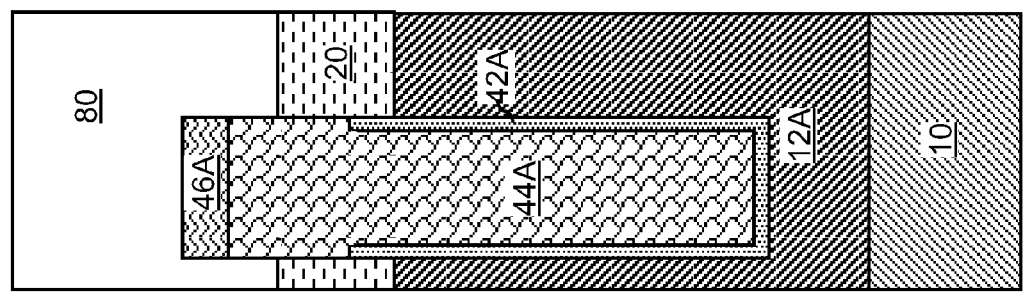
FIG. 14D is a vertical cross-sectional view of the third exemplary semiconductor structure along the vertical plane D-D' of FIG. 14A.

Referring to FIGS. 14A-14D, a third exemplary semiconductor structure according to a third embodiment of the present disclosure can be derived from the first exemplary semiconductor structure by recessing the contiguous dielectric material layer to different depths across the first device region 100A and the second device region 100B. Specifically, the contiguous material layer is recessed to a depth not lower than the recess depth of the inner electrodes 44A in the first device region 100A. Various masking layers and/or disposable material portions can be employed to pattern the contiguous dielectric material layer in the second device region 100B such that the top portion of the dielectric material liners 42B to protrude above the top surface of the insulator layer 20. Consequently, each widthwise sidewall of the second semiconductor fins 30B can be in physical contact with a sidewall of a dielectric material liner 42B and a sidewall of a second trench top dielectric portion 46B.

The presence of the second trenches in the second device region 100B has the effect of stabilizing a pattern-factor dependency of the etch process for forming the trenches (11A, 11B), thereby providing uniform trench profiles for the first trenches 11A in the first device region 100A. The second trenches 11B function as dummy trenches that stabilize the trench etch process, and renders the characteristics of the trench etch process less dependent on what percentage of the substrate includes devices employing deep trenches (such as embedded dynamic random access memory devices) and what percentage of the substrate does not utilize deep trenches as a component of semiconductor devices. By incorporating dummy trench structures within the logic areas (such as the second device regions 100B), the dummy trench structures stabilize the deep trench etch process although the dummy trench structures are electrically isolated from other devices and are not employed as a component of any semiconductor device.

In one embodiment, a bulk semiconductor substrate can be employed in lieu of a semiconductor-on-insulator (SOI) substrate. In this case, semiconductor fins can be formed by patterning an upper portion of the bulk semiconductor substrate, and a shallow trench isolation layer can be formed on the recessed surfaces of the bulk semiconductor substrate and around lower portions of the semiconductor fins to provide electrical isolation among the semiconductor fins. Suitable doped wells can also be formed to enhance electrical isolation among neighboring semiconductor fins.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:

a dielectric material liner located within a lower portion of a trench in a substrate, wherein outer surfaces of said dielectric material liner contacts surfaces of a buried plate comprising a doped semiconductor material and inner surfaces of said dielectric material liner contact a conductive material portion, said conductive material portion defining, in part, a trench capacitor embedded within said substrate;

a trench top dielectric portion located within an upper portion of said trench and contacting said dielectric material liner and an entirety of a top surface of said conductive material portion; and an insulator layer laterally contacting sidewalls of said trench top dielectric portion and said dielectric material liner, wherein said conductive material portion defining, at least in part, an inner electrode of said trench capacitor is encapsulated by said dielectric material liner, said trench top dielectric portion, and a sidewall of said insulator layer.

2. The semiconductor structure of claim 1, further comprising a semiconductor fin located on a top surface of said insulator layer, wherein a widthwise sidewall of said semiconductor fin is vertically coincident with a sidewall of said trench top dielectric portion.

3. The semiconductor structure of claim 2, wherein a top surface of said trench top dielectric portion is located within a horizontal plane not higher than a top surface of said semiconductor fin and not lower than a bottom surface of said insulator layer.

4. The semiconductor structure of claim 1, wherein a topmost surface of said dielectric material liner contacts a bottom surface of said trench top dielectric portion.

5. The semiconductor structure of claim 1, wherein an inner sidewall of said dielectric material liner contacts a sidewall of said trench top dielectric portion.

6. The semiconductor structure of claim 1, further comprising said trench capacitor embedded within said substrate, wherein a node dielectric of said trench capacitor comprises a same material as said dielectric material liner.

7. The semiconductor structure of claim 6, wherein said inner electrode of said trench capacitor comprises a same material as said conductive material portion and an outer electrode of said trench capacitor is another buried plate comprising a same material as said buried plate.

8. The semiconductor structure of claim 6, further comprising a semiconductor fin located on a top surface of said insulator layer and laterally contacting an inner electrode of said trench capacitor.

9. The semiconductor structure of claim 6, further comprising another trench top dielectric portion contacting a top surface of an inner electrode of said trench capacitor, wherein a top surface of said another trench top dielectric portion is located within a horizontal plane located above another horizontal plane that includes a top surface of said trench top dielectric portion.

* * * * *